(12) United States Patent  
Seki et al.

(10) Patent No.: US 7,187,554 B2
(45) Date of Patent: Mar. 6, 2007

(54) MOVABLE CONSOLE DEVICE

(75) Inventors: Fujio Seki, Shinagawa (JP); Heiichi Sugino, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 0 days.

(21) Appl. No.: 10/916,589

(22) Filed: Aug. 12, 2004

(65) Prior Publication Data

US 2005/0035262 A1 Feb. 17, 2005

(30) Foreign Application Priority Data

Aug. 15, 2003 (JP) .............................. 2003-293753
Dec. 24, 2003 (JP) .............................. 2003-427941

(51) Int. Cl.
H05K 7/16 (2006.01)
(52) U.S. Cl. ..................................................... 361/727
(58) Field of Classification Search ................ 361/680, 361/681, 724–727
See application file for complete search history.

(56) References Cited

U.S. PATENT DOCUMENTS

| 5,388,032 | A | * | 2/1995 | Gill et al. ....................... 700/17 |
| 6,097,595 | A | * | 8/2000 | Cipolla ......................... 361/687 |
| 6,142,590 | A | * | 11/2000 | Harwell .................... 312/223.1 |
| 6,144,554 | A | | 11/2000 | Mok |
| 6,172,868 | B1 | * | 1/2001 | Oura ........................... 361/680 |
| 6,175,492 | B1 | * | 1/2001 | Nobuchi ....................... 361/687 |
| 6,442,030 | B1 | * | 8/2002 | Mammoser et al. ........ 361/727 |
| 6,563,700 | B1 | * | 5/2003 | Waller et al. ............... 361/683 |
| 6,945,412 | B2 | * | 9/2005 | Felcman et al. .............. 211/26 |

FOREIGN PATENT DOCUMENTS

JP 2000-29565 1/2000

OTHER PUBLICATIONS

European Search Report, dated Mar. 22, 2006, for related European Patent Application EP 04 25 4889.1-2214.

* cited by examiner

Primary Examiner—Lynn Feild
Assistant Examiner—Ingrid Wright
(74) Attorney, Agent, or Firm—Staas & Halsey LLP

(57) ABSTRACT

A movable console device having a rack-mount configuration, including a console section and a mount section. The console section includes a keyboard and a display, and is provided with a receiving portion for receiving the keyboard and the display. The mount section is provided for movably mounting the console section onto a rack structure. A display support mechanism is provided for supporting the display on the console section to be displaceable between a non-operating position in which the display is received inside the receiving portion and an operating position in which the display extends outside the receiving portion. A keyboard support mechanism is provided for supporting the keyboard on the console section to be displaceable between a first position in which the keyboard is received inside the receiving portion and a second position different from the first position.

18 Claims, 16 Drawing Sheets

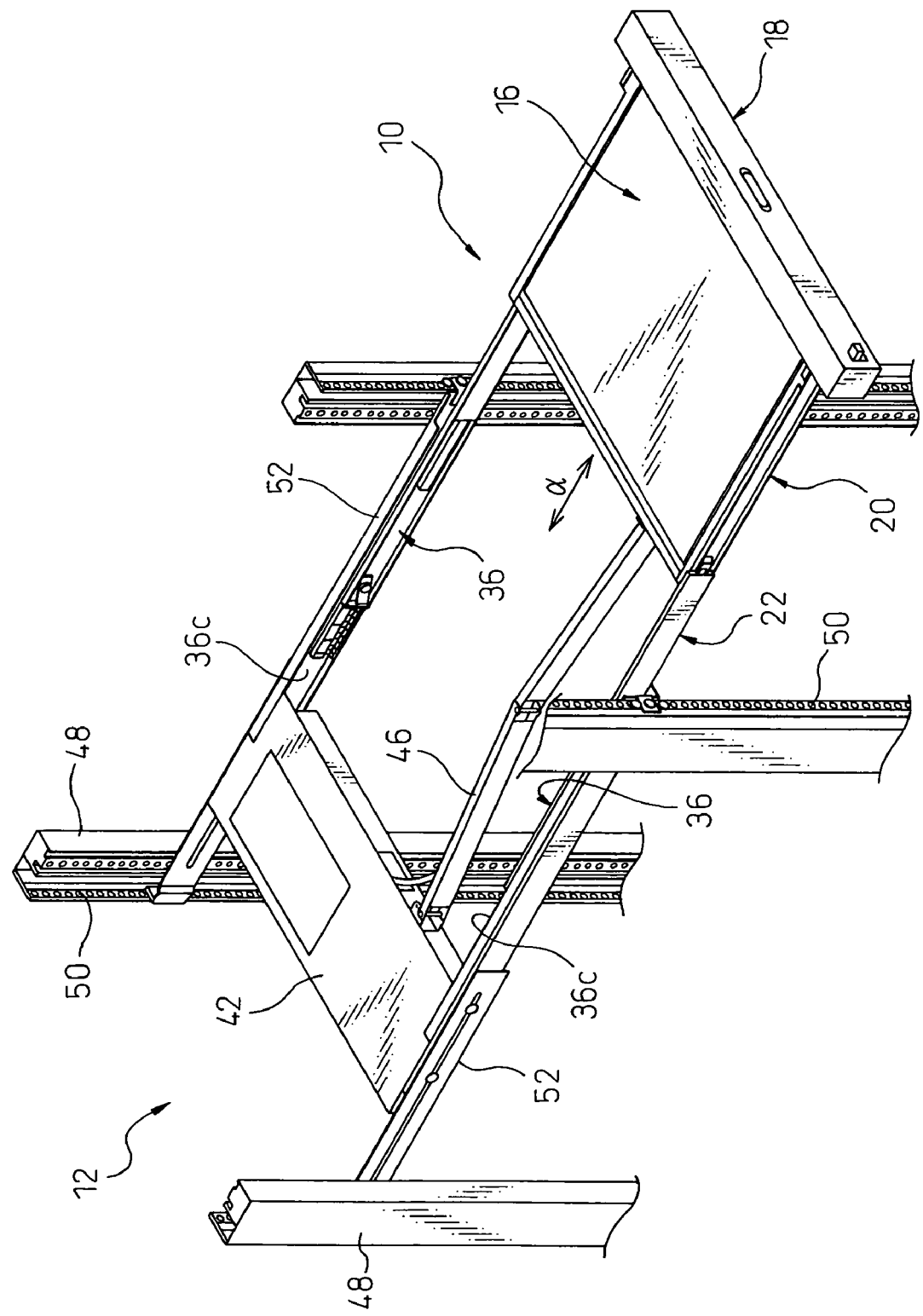

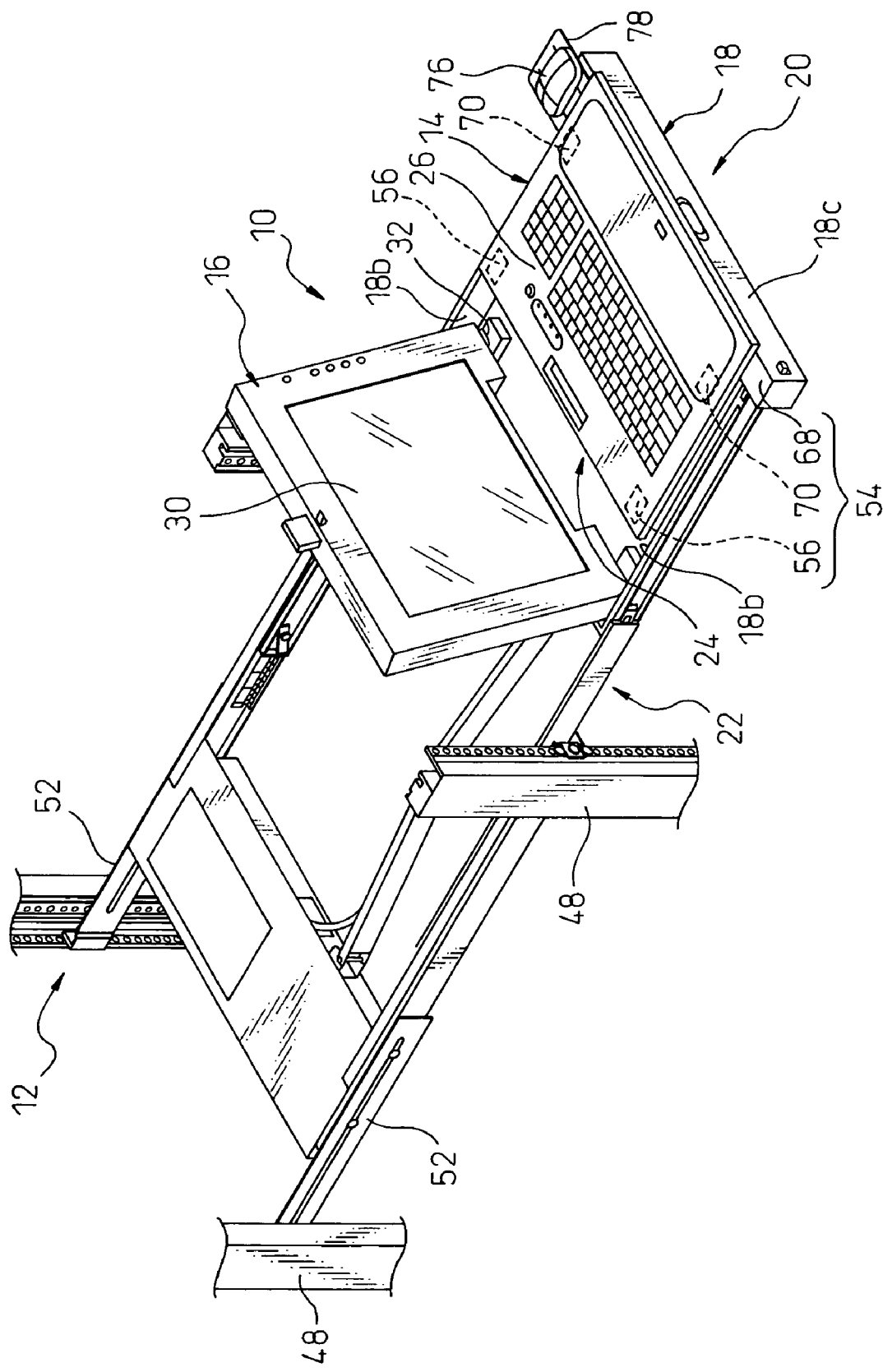

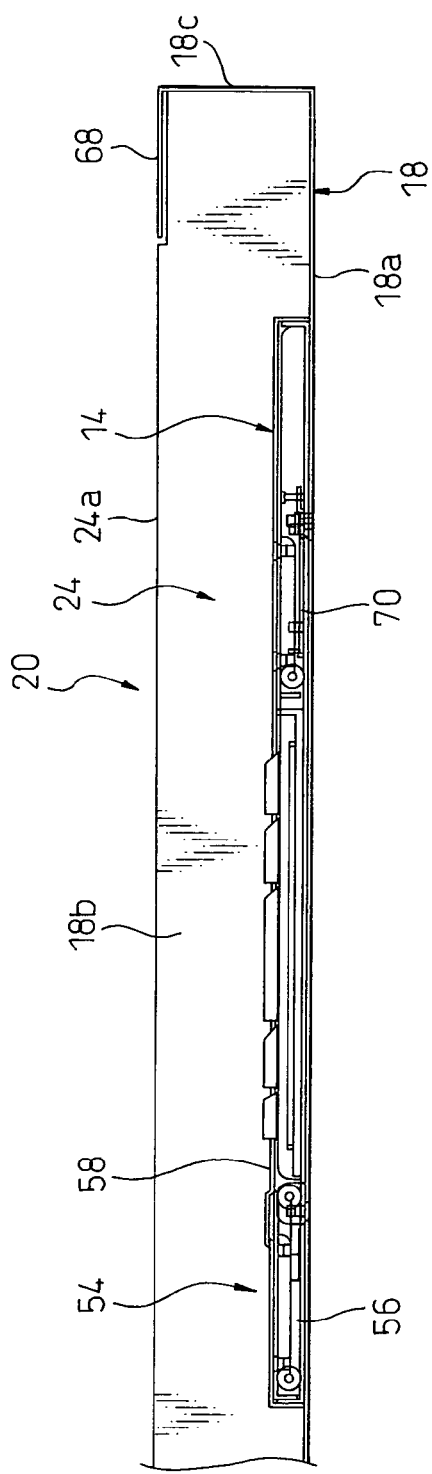
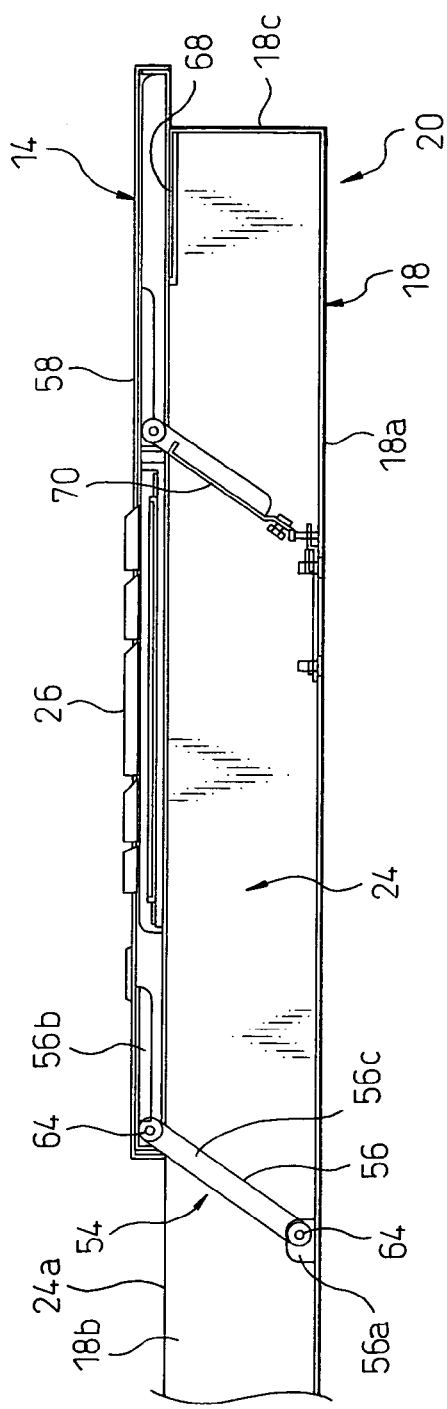
Fig.5A
Fig.5B

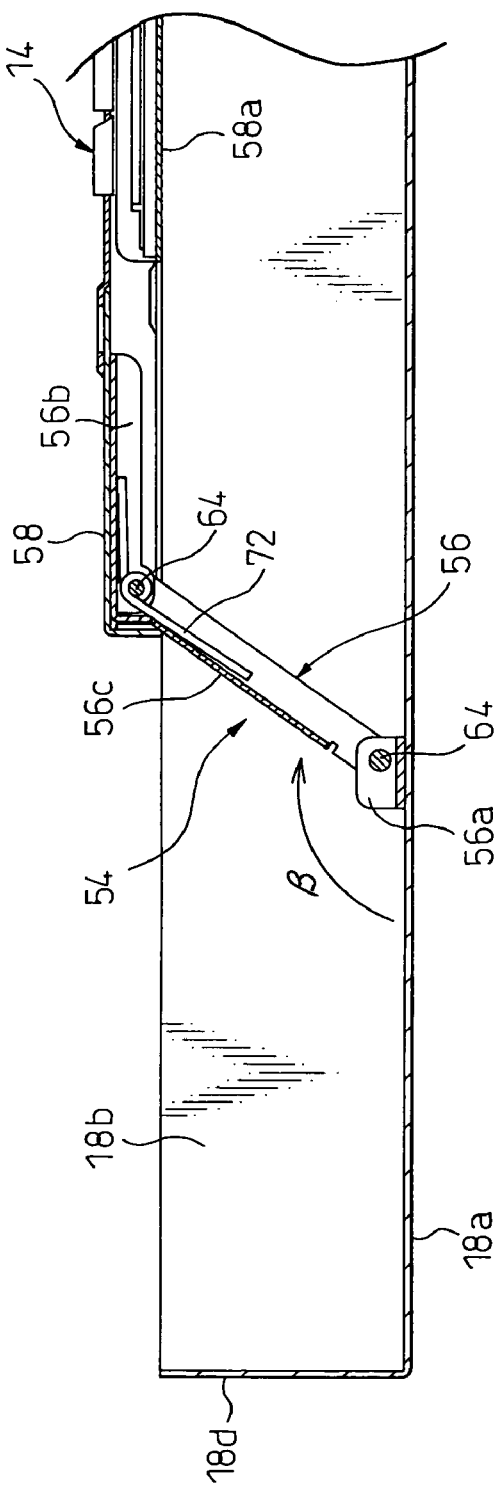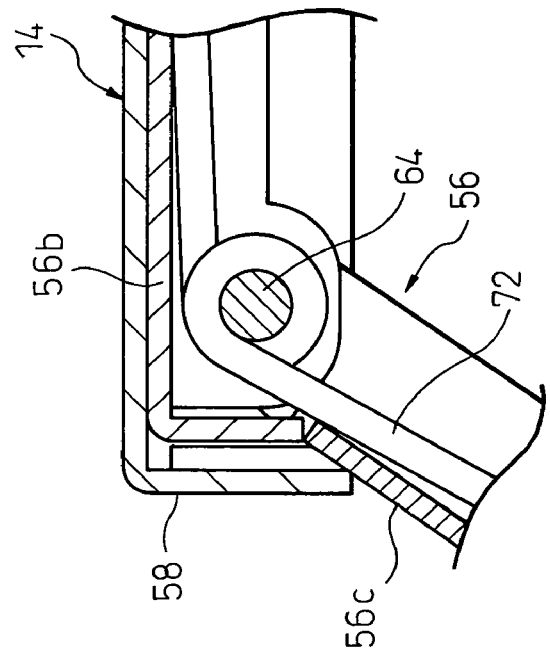

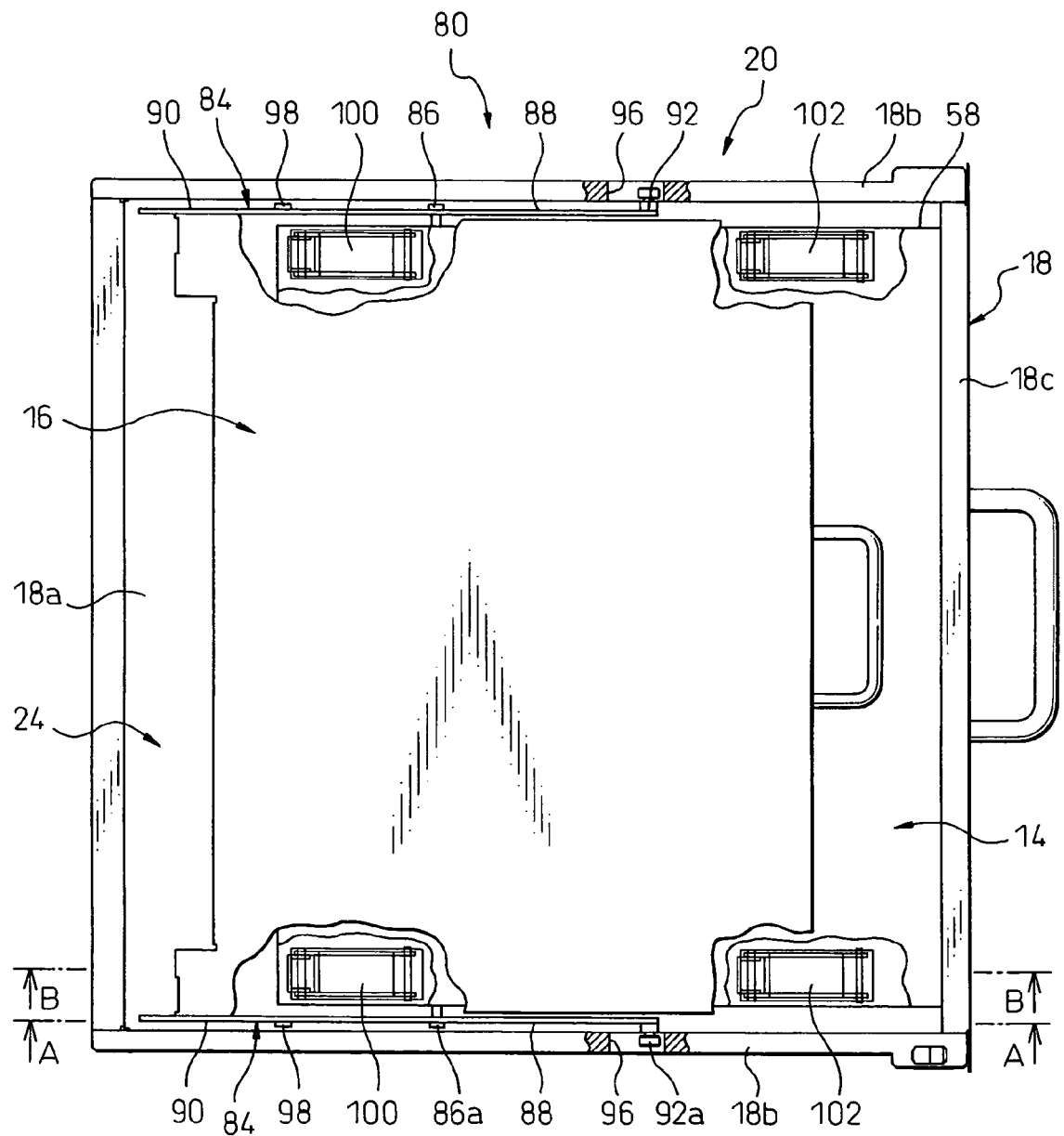

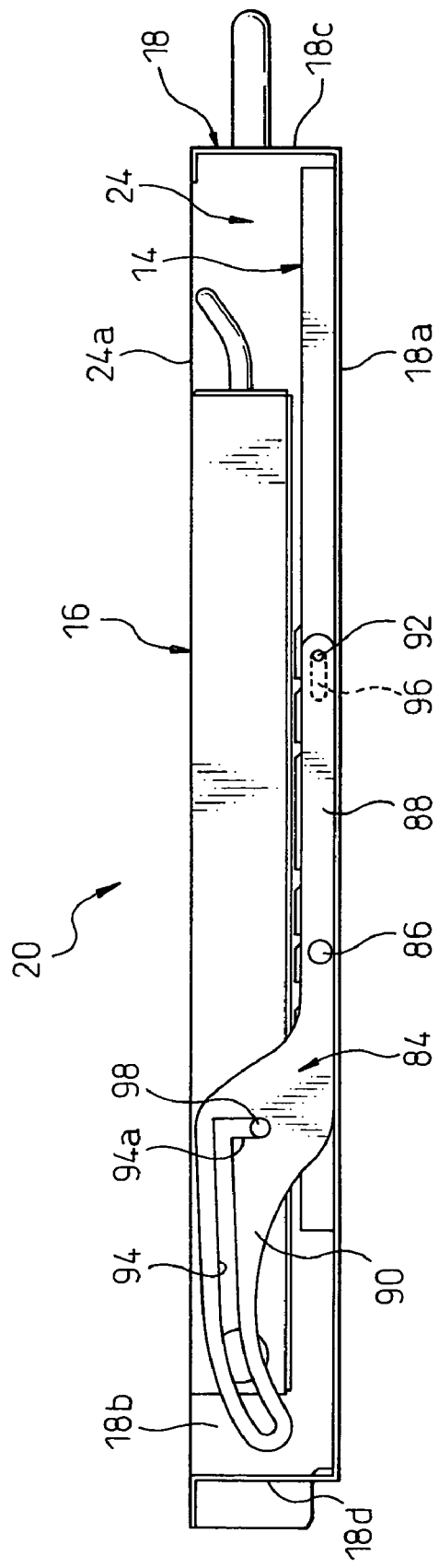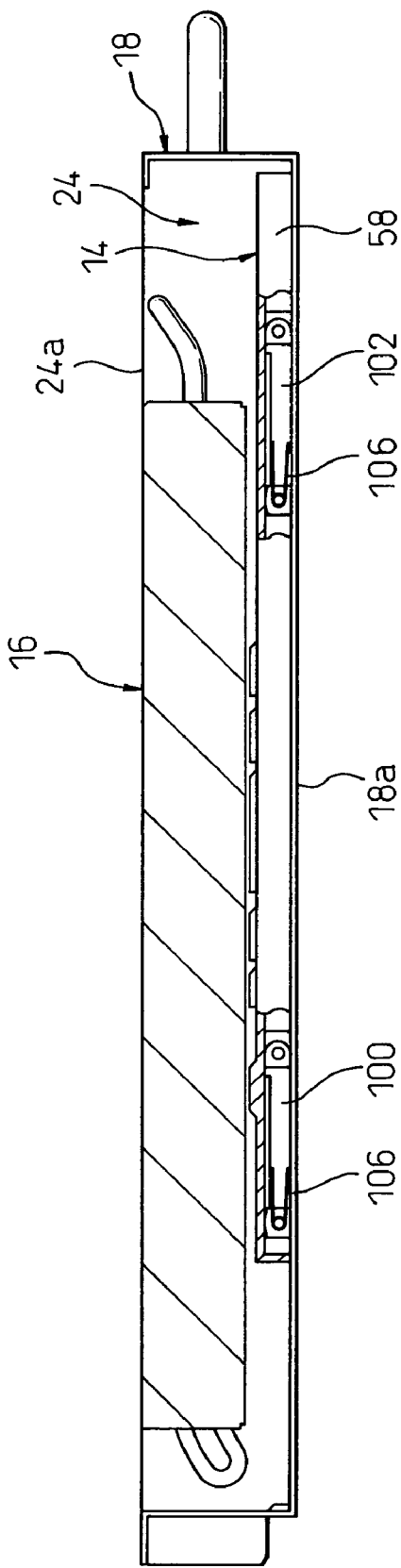

MOVABLE CONSOLE DEVICE

BACKGROUND OF THE INVENTION

1. Field of the Invention

The present invention relates to a movable console device having a rack-mount configuration.

2. Description of the Related Art

In recent years, various electronic devices, such as computers, designed to be mounted for use on a rack having a predetermined dimension, have been developed. This type of electronic device, having a rack-mount configuration, is known as one which possesses superior space-saving features. In such rack-mount type electronic devices, there is known a movable console device (or a so-called console drawer) comprised of a console section including a keyboard (or an input unit) and a display (or an output unit) incorporated in a common frame member, and a mount section for mounting the console section in a linearly movable manner onto a rack structure prepared separately, wherein the movable console device is able to be taken in and out of the rack structure in a drawer-like manner (for example, see Japanese Unexamined Patent Publication (Kokai) No. 2000-29565 (JP-A-2000-29565)).

In the movable console device described in JP-A-2000-29565, the console section includes receiving portions, defined inside a frame member (referred to as "a module" in JP-A-2000-29565) having a predetermined dimension, for receiving individually a keyboard and a display, respectively. The keyboard is fixedly placed on the frame member at a front side (i.e., a near side relative to or as seen by an operator) with the operating surface of the keyboard, on which a plurality of keys are arranged, being exposed. The display is placed on the frame member at a rear side (i.e., a far side relative to or as seen by an operator) and rotatably mounted onto the frame member via a pivotal support mechanism such as a hinge. When the movable console device is not used, the display is accommodated in the receiving portion thereof in a flat or horizontal attitude with the screen surface of the display facing upward, and the screen surface is placed at substantially the same height as the operating surface of the keyboard. In this state, the console section exhibits a plate-like profile having a predetermined dimension as a whole, defined by the outer dimension of the frame member, and is contained in or inserted into the rack structure through the mount section. On the other hand, when the movable console device is used, the console section is drawn out of the rack structure through the mount section, and the display is rotated relative to the frame member, so as to extend outside the receiving portion, and is disposed at an operating position in which the screen surface of the display faces an operator at an appropriate angle.

JP-A-2000-29565 also discloses another movable console device configured so that, when the movable console device is not used, the display is laid on the keyboard with the screen surface of the display facing the operating surface of the keyboard. In this configuration, the height of the plate-like profile exhibited by the console section in the non-operating state is twice as large as that in the above-described configuration in which the keyboard and the display are arranged side by side in the non-operating state. In this connection, in the technical field of the rack-mount type electronic devices, the height dimension of the electronic devices to be contained in the rack structure has been standardized in such a manner that, for example, the height of a unit shelf zone in a so-called "19-inch width" rack structure is indicated as "1U (=44.45 mm)"(according to EIA (Electronic Industries Association)).

Further, as an improvement of the above configuration in which the keyboard and the display are disposed in a stacked manner in the non-operating state, a movable console device including a thinner console section able to be contained in the shelf zone of the standard unit height (1U) has been developed. In this movable console device, the console section includes a receiving portion for receiving the keyboard and the display in a stacked manner, in the interior of the frame member having at most the height "1U". The keyboard has a low-profile structure and is fixedly placed on a bottom region of the receiving portion in the frame member with the operating surface of the keyboard being upwardly exposed. The display has a thinner display element, such as an LCD (Liquid Crystal Display), and is rotatably mounted on the frame member adjacent to the keyboard at a far side relative to or as seen by the operator. When the movable console device is not used, the display is accommodated in the receiving portion in such a manner as to be laid on the keyboard with the screen surface of the display facing to the operating surface of the keyboard, and, in this state, the console section exhibits a plate-like profile having substantially the height "1U". On the other hand, when the movable console device is used, the display is rotated relative to the frame member so as to extend outside the receiving portion and is disposed at an operating position where the screen surface of the display faces an operator at an appropriate angle, and thereby the operating surface of the keyboard is opened.

In the above-described movable console device including the thinner console section for accommodating the keyboard and the display in a stacked manner inside the frame member during the non-operating state, the frame member is provided with lateral wall parts extending along both the left and right sides of the keyboard as seen from an operator, so as to define the receiving portion capable of receiving the display above the operating surface of the keyboard. The lateral wall parts also act as rail base-panels provided on the console section for a slide rail mechanism as a component of the mount section, which are essential elements for affording a slidability to the mount section under certain dimensional limitations of the mount section. As a result of this construction of the frame member, when the movable console device is used (i.e., when the display is disposed in the operating position), the operator's hands operating the keyboard may hit the lateral wall parts of the frame member and a smooth key-operation may be thereby obstructed. Further, when it is desired to use a handheld-type pointing device such as a mouse, it is difficult to ensure or establish a surface for driving the handheld-type pointing device in the console section, especially in the case of such a thin structure.

SUMMARY OF THE INVENTION

It is an object of the present invention to provide a movable console device having a rack-mount configuration and including a console section into which a keyboard and a display are incorporated, wherein the movable console device has a thinner structure able to be contained in a shelf zone having a standard unit height, and allows an operator to freely move operator's hands for operating the keyboard and to perform a smooth key-entry operation during the operating state of the console device.

It is another object of the present invention to provide a movable console device having a rack-mount configuration and including a console section into which a keyboard and a display are incorporated, wherein the movable console device has a thinner structure contained in a shelf zone having a standard unit height, and permits, when a handheld-type pointing device such as a mouse is used, a surface for driving the handheld-type pointing device to be readily ensured.

In accordance with the present invention, there is provided a movable console device having a rack-mount configuration, comprising a console section including a keyboard and a display, the console section being provided with a receiving portion for receiving the keyboard and the display; a display support mechanism supporting the display on the console section to be displaceable between a non-operating position in which the display is received inside the receiving portion and an operating position in which the display extends outside the receiving portion; a keyboard support mechanism supporting the keyboard on the console section to be displaceable between a first position in which the keyboard is received inside the receiving portion and a second position different from the first position; and a mount section for movably mounting the console section onto a rack structure.

In the above movable console device, the receiving portion of the console section may have an open end, through which the display in the operating position extends outwardly, and the keyboard support mechanism may support the keyboard in the second position to locate an operating surface of the keyboard in close proximity to the open end.

The keyboard support mechanism may fixedly hold the keyboard in the second position against a pressing force applied to an operating surface of the keyboard.

The keyboard support mechanism may include an interlocking member for interlocking a displacement motion of the keyboard between the first position and the second position and a displacement motion of the display between the non-operating position and the operating position with each other.

The console section may include a frame member defining the receiving portion, and the keyboard support mechanism may include a first movable leg member arranged between the frame member and the keyboard to guide the keyboard between the first position and the second position.

The first movable leg member may include a buffering element for buffering a displacement motion of the keyboard from the second position to the first position.

The keyboard support mechanism may include a second movable leg member arranged between the frame member and the keyboard, the first movable leg member and the second movable leg member cooperating in synchronization to shift the keyboard between the first position and the second position in parallel translation.

The keyboard support mechanism may include a support surface provided in association with the frame member, the support surface supporting the keyboard at the second position.

The console section may further include an auxiliary stage on which a handheld-type pointing device is placed, the auxiliary stage being shiftable relative to the keyboard.

The console section may exhibit a plate-like profile able to be contained in a shelf zone of a standard unit height, in a condition where the keyboard and the display are received within the receiving portion.

BRIEF DESCRIPTION OF THE DRAWINGS

The above and other objects, features and advantages of the present invention will become more apparent from the following description of preferred embodiments in connection with the accompanying drawings, in which:

FIG. 3 is a perspective view showing the movable console device of FIG. 1 that is mounted onto a rack structure;

FIG. 4 is a perspective view showing the movable console device of FIG. 1, mounted onto the rack structure, in an operational state;

FIGS. 5A and 5B are longitudinal cross-sectional views of the movable console device of FIG. 1, wherein FIG. 5A shows a state in which a keyboard is in a first position and FIG. 5B shows a state in which the keyboard is in a second position;

FIGS. 7A to 7C are illustrations for explaining the operation of the keyboard support mechanism of FIG. 6, wherein FIG. 7A shows an operating state in a folded position, FIG. 7B shows an operating state in an intermediate position and FIG. 7C shows an operating state in an open position, respectively;

FIGS. 8A and 8B are illustrations for explaining the operation of the keyboard support mechanism of FIG. 6, wherein FIG. 8A shows an operating state when the keyboard is in the second position and FIG. 8B is an enlarged view of a principal part of the keyboard in the second position;

FIG. 12 is a partially cutaway plan view showing the movable console device of FIG. 11 in the folded state;

FIG. 13A is a sectional view of the movable console device in the folded state taken along a line A—A of FIG. 12;

FIG. 13B is a sectional view of the movable console device in the folded state taken along a line B—B of FIG. 12;

DESCRIPTION OF THE PREFERRED EMBODIMENT

Figure 1:
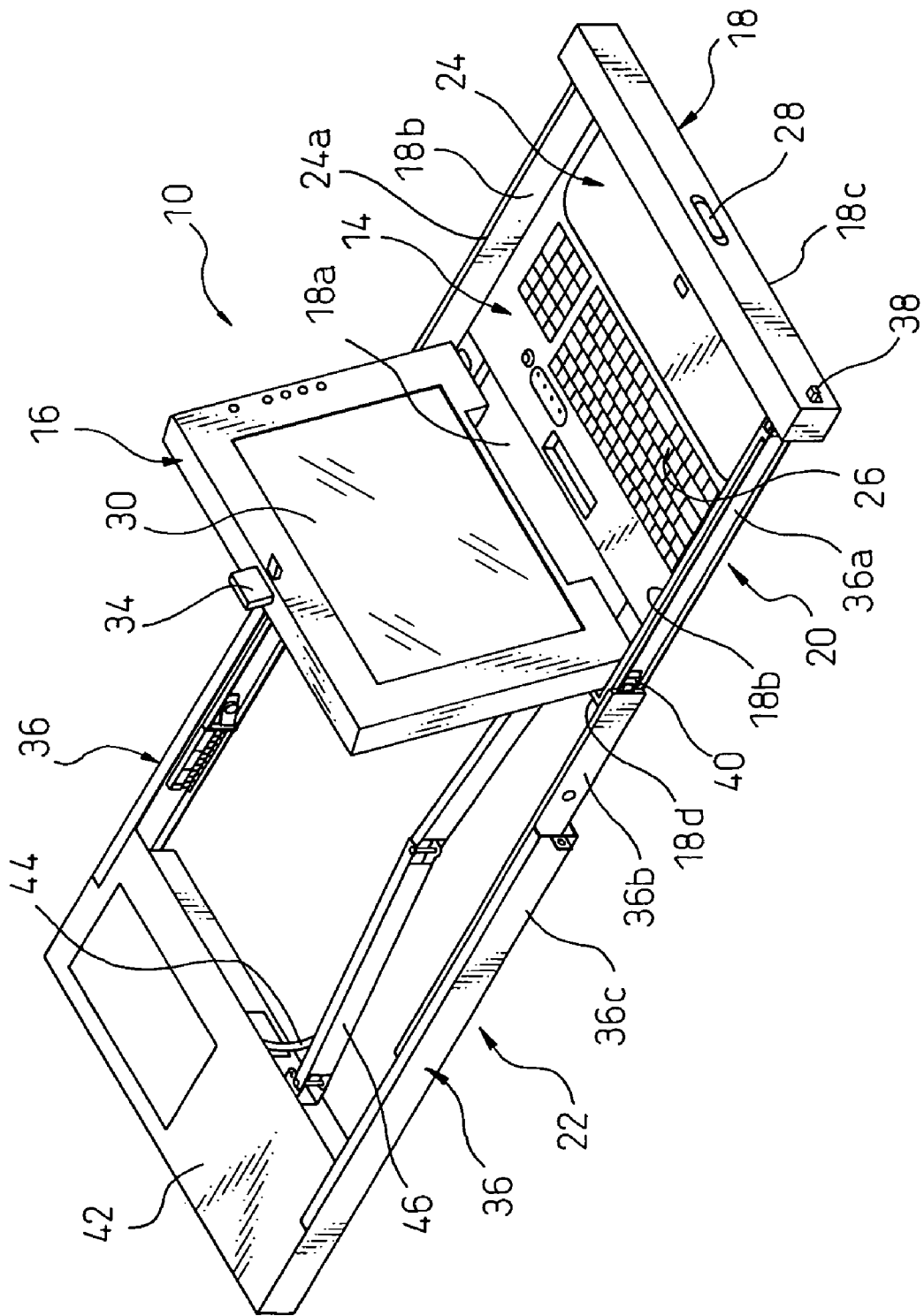
FIG. 1 is a perspective view showing a movable console device according to a first embodiment of the present invention in an unfolded state.
Figure 2:
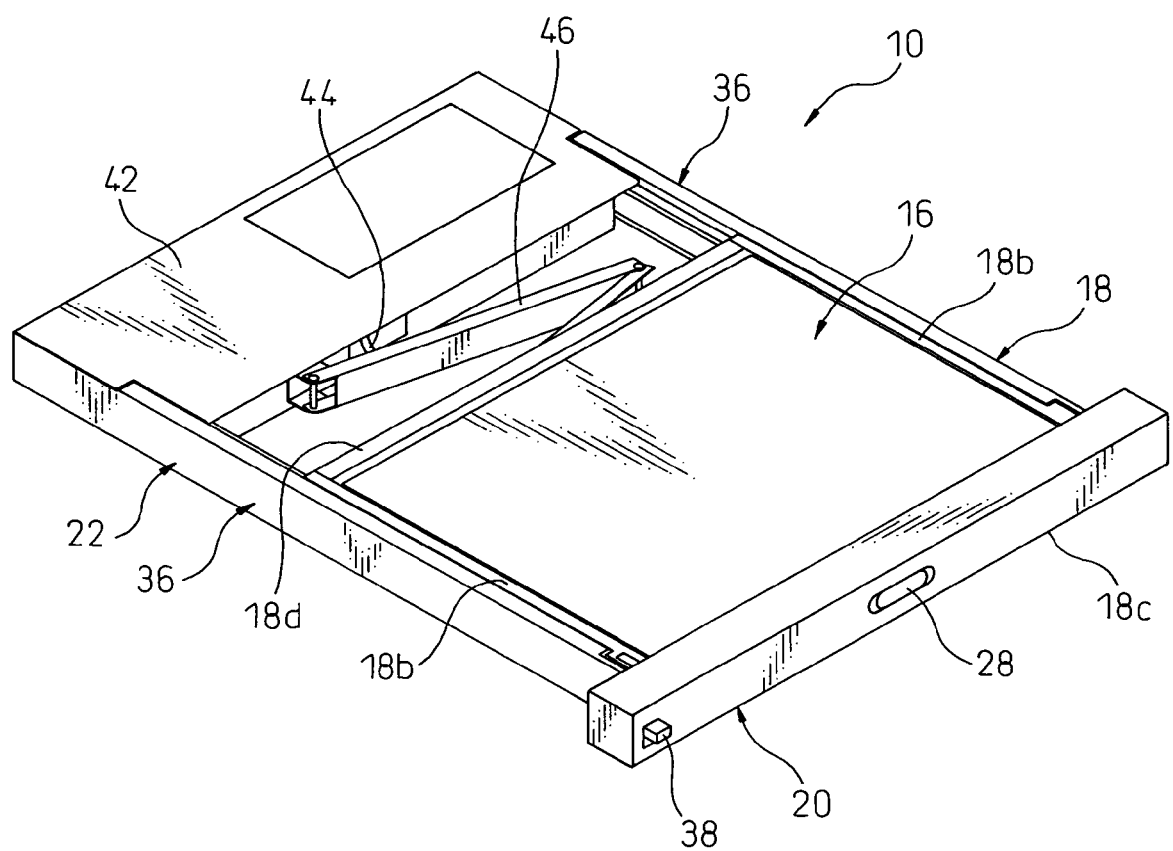
FIG. 2 is a perspective view showing the movable console device of FIG. 1 in a folded state.

Referring to the drawings, in which the same or similar components are denoted by common reference numerals, FIG. 1 is a perspective view showing a movable console device 10 according to a first embodiment of the present invention in an unfolded or expansion state, FIG. 2 is a perspective view showing the movable console device 10 in a folded or contraction state, FIG. 3 is a perspective view showing the movable console device 10 in a state as to be mounted onto a rack structure 12, and FIG. 4 is a perspective view showing the movable console device 10 mounted onto the rack structure in an operating state.

The movable console device 10 includes a console section 20 constituted by incorporating a keyboard (or an input unit) 14 and a display (or an output unit) 16 into a common frame member 18, and a mount section 22 for mounting the console section 20 in a linearly movable manner onto a rack structure 12 prepared separately. The movable console device 10 is mounted onto the rack structure 12 having a predetermined mount-area dimension, through the mount section 22 at a desired height position, as described below, and, in this state, is able to be taken in and out of the rack structure 12 in a drawer-like manner.

The console section 20 has a thinner structure contained in a shelf zone of a standard unit height (1U=44.45 mm) defined on the rack structure 12, and is provided, in the interior of the frame member 18 having a height of 1U or less, with a receiving portion 24 for receiving the keyboard 14 and the display 16 in a manner so as to be stacked on each other. The keyboard 14 has a low-profile structure and is able to be received in the receiving portion 24 of the frame member 18 in a displaceable manner, while maintaining a horizontal attitude with an operating surface 26 of the keyboard, on which a plurality of keys are arranged in a predetermined array, being exposed upward. The display 16 includes a thinner display element such as an LCD (liquid crystal display), and is rotatably mounted on the frame member 18 adjacent to the keyboard 14 at a far side as seen by an operator.

The frame member 18 includes a bottom wall 18a having a rectangular flat-plate shape, a pair of lateral walls 18b extending parallel to each other along opposite lateral edges of the bottom wall 18a, a front wall 18c disposed to be faceable to an operator and extending between the lateral walls 18b along one (or a front) edge of the bottom wall 18a, and a rear wall 18d extending between the lateral walls 18b along another (or a rear) edge of the bottom wall 18a and parallel to the front wall 18c. These walls 18a to 18d cooperate with each other to define the bottomed concave receiving portion 24. The lateral walls 18b, the front wall 18c and the rear wall 18d protrude from the bottom wall 18a to a height substantially identical to each other, so that the height of the frame member 18 is, in its entirety, defined to be slightly smaller than 1U. The lateral walls 18b, the front wall 18c and the rear wall 18d cooperate with one another at top inner edges thereof to define an open end 24a of the receiving portion 24, which allows the display 16 to extend outside the frame member 18 when the display 16 is in an operating position, as described later. Note that the lateral walls 18b also act as rail base-panels provided on the console section 20 for a slide rail mechanism as a component of the mount section 22, as described later. Further, the front wall 18c is provided with a handle part 28 for allowing the operator to linearly move the console section 20 mounted onto the rack structure 12, as described later.

When the movable console device 10 is not used, the console section 20 is able to accommodate the display 16 in the receiving portion 24, in such a manner that the display 16 is laid on the keyboard 14 with a screen surface 30 of the display facing to the operating surface 26 of the keyboard 14. In this state, the console section 20 substantially exhibits a plate-like profile having a height "1U" (FIG. 2). On the other hand, when the movable console device 10 is used, the display 16 is rotated with respect to the frame member 18 from a non-operating position where the display 16 is received inside the receiving portion 24, so as to extend outside the receiving portion 24 through the open end 24a thereof, and is disposed at an operating position where the screen surface 30 of the display 16 faces an operator at an appropriate angle. When the display 16 is in the operating position, the operating surface 26 of the keyboard 14 is opened (FIG. 4). In this connection, in order to allow such a displacement of the display 16, a pivotal support mechanism 32, such as a hinge or a support pin, is provided as a display support mechanism at an appropriate position on the frame member 18. Further, the console section 20 may be provided with a latch mechanism 34 for anchoring the display 16 at the non-operating position.

The mount section 22 includes a pair of slide rail mechanisms 36 that are mounted onto the respective lateral walls 18b of the frame member 18. Each of the slide rail mechanisms 36 is comprised of a plurality of (three, in the drawing) rails slidable relative to each other in a telescopic manner. In these slide rail mechanisms 36, innermost rails 36a are fastened to the respective lateral walls 18b of the frame member 18 of the console section 20 from an outside thereof, so that the respective intermediate rails 36b and the outermost rails 36c are able to extend and retract, in a direction parallel to each other, with respect to the console section 20 over a predetermined distance range. The outermost rail 36c of each slide rail mechanism 36 is fastened to the rack structure 12 as described later. In this connection, the mount section 22 may include latch mechanisms 38, 40 for anchoring each slide rail mechanism 36 at the most extended and retracted positions, respectively.

The movable console device 10 may optionally include an auxiliary functional section 42 that is functionally independent of the console section 20 and carried on the mount section 20. The auxiliary functional section 42 may contain, for example, a switching device (not shown) for switchably connecting the keyboard 14 and the display 16 of the console section 20 to a power supply circuit, various other electronic devices (a server and the like, not shown) mounted on the rack structure 12 as a multi-layer stacking system, and so on. In this arrangement, as illustrated, a foldable cable holder 46 is provided between the console section 20 and the auxiliary functional section 42 for holding power and signal cables 44 laid therebetween and guiding the cables 44 in a certain wiring direction.

The rack structure 12, on which the movable console device 10 is mounted, includes a plurality (four, in the drawing) of pillars 48 uprightly disposed in parallel to each other and extending in a vertical direction relative to a certain rack-mounting surface (not shown), and defines a mount area having predetermined dimensions (e.g., a so-called "19-inch width") in a region surrounded by the pillars 48. Each of the pillars 48 is provided with multiple shelf-attachment holes 50 disposed at certain intervals in a longitudinal direction. The shelf-attachment holes 50 are used to fixedly attach a pair of guide rails 52 in parallel to each other between respective pairs of the pillars 48, wherein the pairs of pillars 48 for the respective guide rails 52 are different from each other. Each slide rail mechanism 36 of the mount section 22 of the movable console device 10 is received and fixedly supported by the corresponding guide rail 52 in a state where an outermost rail 36c is fixed to one pillar 48 by also using the shelf-attachment holes 50. The movable console device 10 is thus mounted at a desired height position on the pillars 48 through the mount section 22 horizontally relative to the rack-mounting surface and, in this normal mounting position, the console section 20 is able to linearly reciprocate in the horizontal direction on the rack structure 12 (as shown by an arrow α in FIG. 3).

As shown in FIGS. 5A and 5B, the movable console device 10 is characterized by the provision of a keyboard support mechanism 54, arranged in the console section 20, for supporting the keyboard 14 in a displaceable manner between a first position in which the keyboard 14 is received or accommodated inside the receiving portion 24 (FIG. 5A) and a second position different from the first position (FIG. 5B). The keyboard support mechanism 54 supports the keyboard 14 in the second position to locate the operating surface 26 thereof in close proximity to, but slightly outside of, the open end 24a of the receiving portion 24, and fixedly holds the keyboard 14 at the second position against an external force (in particular, a pressing force applied to the operating surface 26 by the operator's hands in a key entry operation).

In the illustrated embodiment, the keyboard support mechanism 54 includes a pair of movable leg members 56 provided between the frame member 18 and the keyboard 14. The movable leg members 56 are disposed adjacent to left and right corners, at a far side as seen by an operator, on a housing 58 of the keyboard 14 (FIGS. 4, 5A and 5B). During the displacement of the keyboard 14 between the first position and the second position, each movable leg member 56 itself generates a specific motion, as described later, to guide the keyboard 14 or, in particular, its far-side region along a predetermined displacement path.

Figure 6:
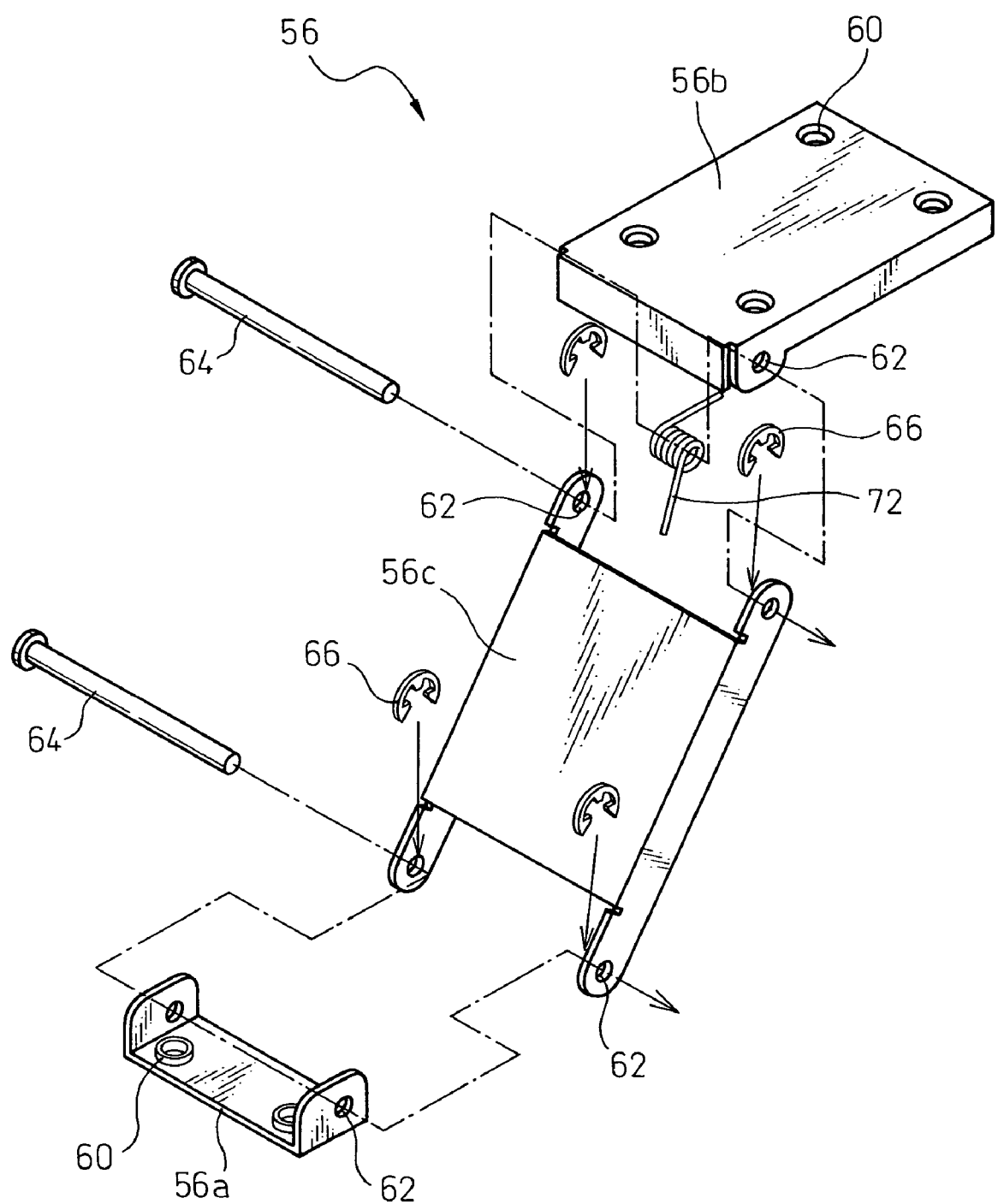
FIG. 6 is an exploded perspective view showing a keyboard support mechanism of the movable console device of FIG. 1.

More specifically, as shown in FIG. 6, each of the movable leg members 56 includes a first fixed piece 56a secured to the frame member 18, a second fixed piece 56b secured to the keyboard 14, and a swinging piece 56c rotatably joined to each of the first fixed piece 56a and the second fixed piece 56b to extend therebetween. The first fixed piece 56a is a thin plate element formed by, e.g., bending a sheet metal material into a U-shaped cross-section, and is provided on the major plate part thereof with two internal threads 60 and on the respective lateral plate parts thereof with shaft holes 62. The second fixed piece 56b is a thin plate element formed by, e.g., bending a sheet metal material into a U-shaped cross-section, and is provided on the major plate part thereof with four internal threads 60 and on the respective lateral plate parts with shaft holes 62 at one longitudinal end of each lateral plate part. The swinging piece 56c is a thin plate element formed by, e.g., bending a sheet metal material into a U-shaped cross-section, and is provided on the respective lateral plate parts with shaft holes 62 at the opposite longitudinal ends of each lateral plate part.

The first fixed piece 56a of each movable leg member 56 is secured to the bottom wall 18a of the frame member 18 by bolts (not shown) screwed into the respective internal threads 60. Similarly, the second fixed piece 56b of each movable leg member 56 is secured to the housing 58 of the keyboard 14 by bolts (not shown) screwed into the respective internal threads 60. The swinging piece 56c of each movable leg member 56 is rotatably joined to the first fixed piece 56a through a pivot shaft 64 inserted through the shaft holes 62 at one longitudinal end and the shaft holes 62 of the first fixed piece 56a. Similarly, the swinging piece 56c is rotatably joined to the second fixed piece 56b through a pivot shaft 64 inserted through the shaft holes 62 at the other longitudinal end and the shaft holes 62 of the second fixed piece 56b. Each of the pivot shafts 64 is held by two retaining rings 66 so as not to fall out of the corresponding shaft holes 62.

Figure 7A:
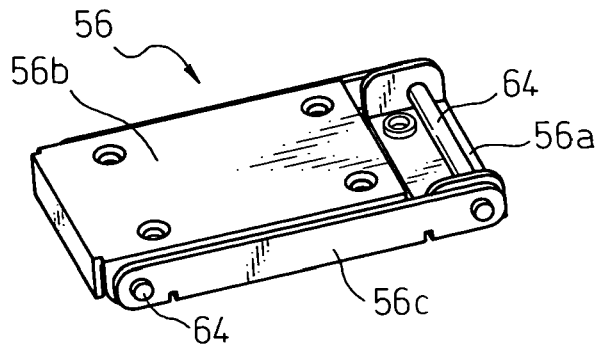
Figure 7B:
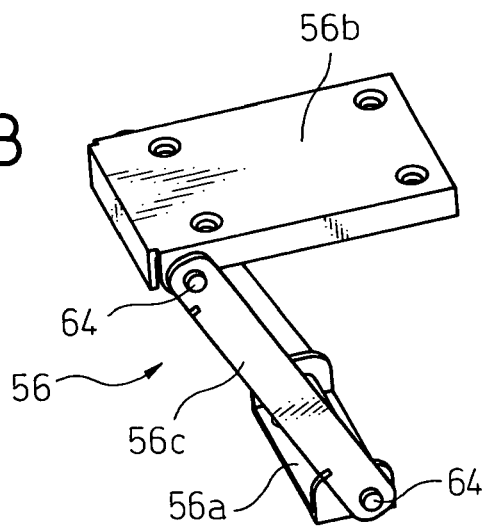
Figure 7C:
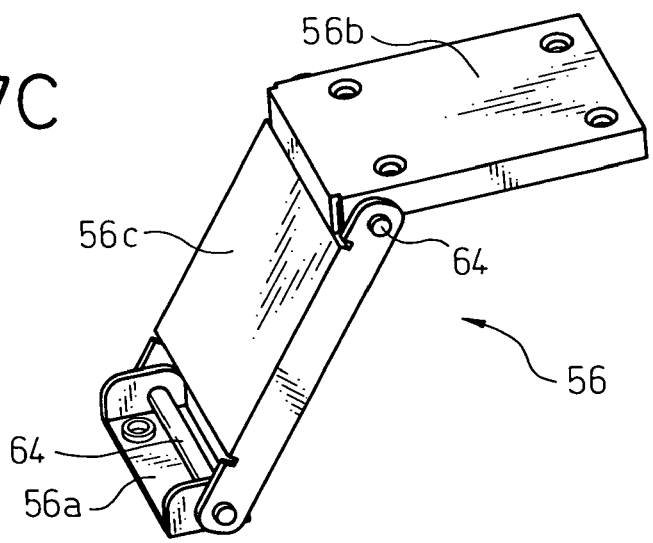

As shown in FIGS. 7A to 7C, each of the movable leg members 56, configured as described above, generates a shifting motion along a circular arcuate orbit, the radius of which is defined by a distance between the pair of pivot shafts 64, between a folded position (FIG. 7A) in which the first and second fixed pieces 56a, 56b are adjacent to each other and received between the major plate part and the lateral plate parts of the swinging piece 56c, an intermediate position (FIG. 7B) in which the first and second fixed pieces 56a, 56b are substantially separated from the swinging piece 56c in respective directions opposite to each other, and an open position (FIG. 7C) in which the swinging piece 56c is disposed at certain angles with respect to the respective first and second fixed pieces 56a, 56b as a final separated state. As a result, during the displacement of the keyboard 14 between the first position and the second position, the far-side region of the keyboard 14, as seen from the operator, moves along the arcuate orbit about the pivot shaft 64 on the first fixed piece 56a secured to the frame member 18.

As shown in FIG. 8A in an enlarged manner, the second fixed piece 56b of each movable leg member 56 is secured to a top plate of the housing 58 of the keyboard 14 and, in the folded position shown in FIG. 7A, each movable leg member 56 is received in its entirety within a recess defined in a corresponding portion of the housing 58. Therefore, the keyboard 14 is, in the first position, held in a flat or horizontal attitude in which a bottom surface 58a of the housing 58 is substantially in contact with the bottom wall 18a of the frame member 18 (FIG. 5A). Also, as shown in FIG. 8B in a further enlarged manner, when the keyboard 14 reaches the second position, the major plate part of the swinging piece 56c of each movable leg member 56 collides against the housing 58 of the keyboard 14 at the edge of the major plate part adjacent to the second fixed piece 56b. At this time, each movable leg member 56 is disposed at a position in which the swinging piece 56c is rotated more than 90° in a direction shown by an arrow β (FIG. 8A) with respect to the first fixed piece 56a (i.e., in the open position shown in FIG. 7C). Then, in this state, the swinging piece 56c and the second fixed piece 56b are mechanically prevented from being rotated further. Thus, the keyboard 14 reaches the second position as its far-side region is displaced more than 90° along the circular orbit from the first position toward the second position, and the movable leg members 56 surely prevent the keyboard 14 from being displaced beyond the second position in a direction toward the frame member's bottom wall 18a.

In the illustrated embodiment, the keyboard support mechanism 54 further includes a support surface 68 provided in association with the frame member 18. The support surface 68 extends substantially parallel to the bottom wall 18a of the frame member 18 from the top edge of the front wall 18c of the latter. The keyboard 14 is supported at the second position by the support surface 68 of the frame member 18 when a region of the bottom surface of the housing 58, in a near-side as seen from the operator, is placed on the support surface 68 (FIG. 5B). Consequently, the keyboard 14 is, in the second position, supported substantially parallel to the frame member's bottom wall 18a by the cooperation of the pair of the movable leg members 56 and the support surface 68, constituting the keyboard support mechanism 54, while the bottom surface 58a of the housing 58 substantially coincides with the locations of the top edges of the respective walls 18b, 18c, 18d of the frame member 18, and is statically held in a stable manner against an external force (in particular, a pressing force applied to the operating surface 26 by the operator's hands in a key entry operation). Note that, though the support surface 68 is not mechanically coupled to the keyboard housing 58, each of the movable leg members 56 is rotated more than 90° at the second position of the keyboard 14 as described above and, therefore, it is ensured that the keyboard 14 is prevented from returning from the second position to the first position due to the pressing force applied by the operator's hands in the key entry operation.

The movable console device 10 configured as described above is operated as follows.

First, as already described, the movable console device 10 is mounted through the mount section 22 to the rack structure 12, in the shelf zone of the standard unit height (1U) at a desired height position on the rack structure 12, in the folded state as shown in FIG. 2, in such a manner as to be able to be taken in and out of the shelf zone. At this time, in the console section 20, the keyboard 14 is disposed at the first position and the display 16 is disposed at the non-operating position, in the interior of the receiving portion 24 defined by the frame member 18. When the movable console device 10 is used, the operator slidingly draws out the console section 20 from the corresponding shelf zone and places it in the front limit position of a linear movement range defined by the slide rail mechanisms 36 of the mount section 22 (FIG. 3). Next, the operator manually pulls up the display 16 on the receiving portion 24 to rotate it from the non-operating position to the operating position on the frame member 18 and, thereafter, manually pulls up the keyboard 14 on the receiving portion 24 to displace it from the first position to the second position on the frame member 18 as described above.

In the condition where the keyboard 14 is disposed in the second position, the operating surface 26 of the keyboard 14 is located outside the receiving portion 24 defined by the frame member 18 due to the function of the keyboard support mechanism 54. In other words, the operating surface 26 is disposed at a position higher than the top ends of the lateral walls 18b with respect to the bottom wall 18a of the frame member 18 (FIG. 5B). Therefore, the operator is capable of performing the key entry operation smoothly on the keyboard 14 located at the second position, without the operator's hands hitting against the lateral walls 18b of the frame member 18. In this connection, after the key entry operation is finished, the keyboard 14 and the display 16 are received or accommodated in the receiving portion 24, and the console section 20 is then contained in or inserted into the predetermined shelf zone of the rack structure 12, along a procedure reverse to the above-described procedure.

In the above embodiment, it is advantageous that the keyboard support mechanism 54 further includes a second pair of movable leg members 70 provided between the frame member 18 and the keyboard 14. The second movable leg members 70 may be disposed adjacent to left and right corners, at a near side as seen from the operator, on the housing 58 of the keyboard 14 (FIGS. 4, 5A and 5B). During the displacement of the keyboard 14 between the first position and the second position, each movable leg member 70 itself generates a specific motion, substantially identical to that of the movable leg member 56 described above, to guide the keyboard 14 or, in particular, its near-side region along a predetermined displacement path of a specific circular orbit. Therefore, when the first pair of movable leg members 56 and the second pair of movable leg members 70 cooperate in synchronization, the keyboard 14 is shifted in a parallel translation between the first position and the second position while maintaining the attitude thereof in parallel to the frame member's bottom wall 18a. Such a configuration allows the operator to displace the keyboard 14 between the first position and the second position quickly and accurately even by one hand. Note that the configuration of the movable leg members 70 is substantially identical to that of the movable leg members 56, and thus the description thereof is not repeated.

In order to quickly and accurately displace the keyboard 14 from the first position to the second position, it is advantageous to provide the keyboard support mechanism 54 with biasing means for biasing the keyboard 14 from the first position toward the second position. The biasing means may be embodied, for example, by a spring 72 for elastically urging the movable leg member 56 from the folded position (FIG. 7A) toward the open position (FIG. 7C) as shown in FIGS. 6, 8A and 8B. In the illustrated example, a torsion coil spring 72 attached to the pivot shaft 64 is provided, as the biasing means, between the second fixed piece 56b and the swinging piece 56c of each movable leg member 56.

Figure 9:
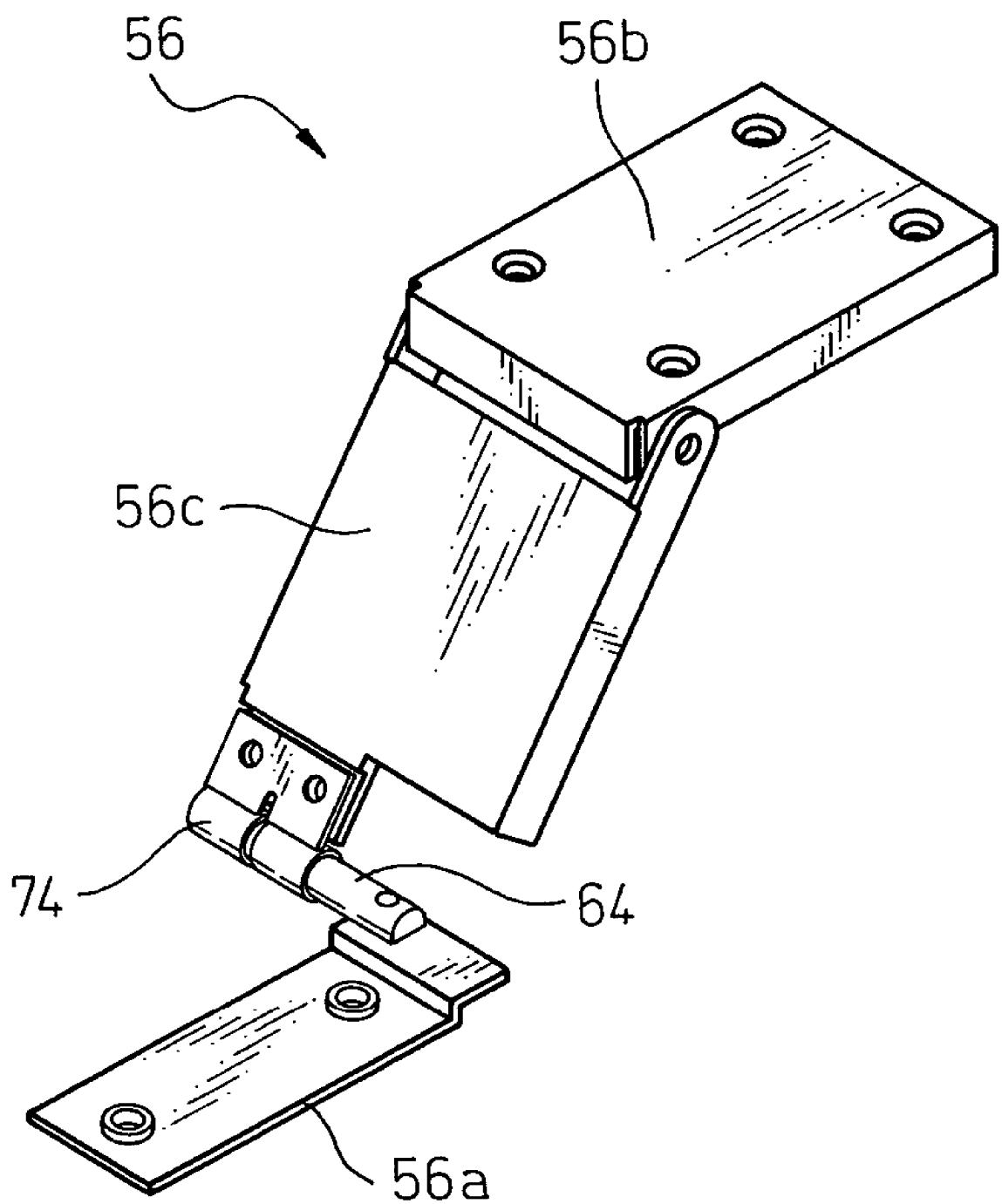
FIG. 9 is a perspective view showing a modification of the keyboard support mechanism.

The spring 72 as the biasing means described above also functions as a buffering element for buffering the displacement motion of the keyboard 14 from the second position to the first position. More specifically, the spring 72 functions to avoid such a disadvantage that the keyboard 14 collides against the bottom wall 18a of the frame member 18 to give a shock to an incorporated electronic circuit due to the carelessness of the operator when the keyboard 14 is displaced from the second position to the first position. Note that, as the buffering element having such a configuration, a torque limiter 74 may be provided on at least one of the pivot shafts 64 of each movable leg member 56, as shown in FIG. 9.

In the movable console device 10 according to the present invention, the console section 20 may also be provided with an auxiliary stage 78 on which a handheld-type pointing device 76, such as a mouse, can be placed (FIG. 4). The auxiliary stage 78 is arranged shiftably between a non-operating position in which it does not protrude outside the frame member 18 and an operating position in which it protrudes outside the frame member 18 (e.g., to a right-hand side as seen from the operator), regardless of the position of the keyboard 14 on the frame member 18. Alternatively, the auxiliary stage 78 may be configured so that it can be shifted between the non-operating position and the operating position only when the keyboard 14 is in the second position, as shown in FIG. 4. In this configuration, in the case where the handheld-type pointing device 76, such as the mouse, is used as an auxiliary input unit, it is possible to readily ensure a surface for driving the pointing device 76 due to the provision of the auxiliary stage 78 able to be taken in and out of the frame member 18 as occasion demands, in spite of the fact that the console section 20 having a thinner structure is adopted.

As apparent from the above description, according to the movable console device 10 having the illustrated configuration, it is possible for the operator to move operator's hands freely for operating the keyboard 14 and to perform a smooth key-entry operation, during the operating state of the movable console device 10, by displacing the keyboard 14 from the first position to the second position under the effect of the keyboard support mechanism 54, in spite of the thinner structure of the movable console device 10 contained in the shelf zone of the standard unit height (1U). Further, when the handheld-type pointing device 76, such as a mouse, is used, it is possible to readily ensure a surface for driving the pointing device 76, due to the provision of the auxiliary stage 78 on the console section 20.

It should be noted that, in the above embodiment, the movable leg members 56, 70 constituting the keyboard support mechanism 54 are not limited to a folding type as the illustrated configuration, but may have various other configurations, such as a rotary type, a telescopic type and so on. Further, the support surface 68 constituting the keyboard support mechanism 54 may be formed at various positions other than the illustrated embodiment.

FIGS. 10 to 14 show a movable console device 80 according to a second embodiment of the present invention. As the configuration of the movable console device 80 is substantially identical to that of the movable console device 10 of the first embodiment except for a keyboard support mechanism 82, corresponding components are denoted by common reference numerals, and the detailed descriptions thereof are not repeated.

The movable console device 80 is provided with a keyboard support mechanism 82 arranged in the console section 20 for supporting the keyboard 14 in a displaceable manner between the first position in which the keyboard 14 is received or accommodated inside the receiving portion 24 of the frame member 18 and the second position different from the first position. The keyboard support mechanism 82 supports the keyboard 14 in the second position to locate the operating surface 26 thereof in close proximity to, but slightly inside of, the open end 24*a* of the receiving portion 24, and fixedly holds the keyboard 14 at the second position against an external force (in particular, a pressing force applied to the operating surface 26 by the operator's hands in a key entry operation).

Figure 10:
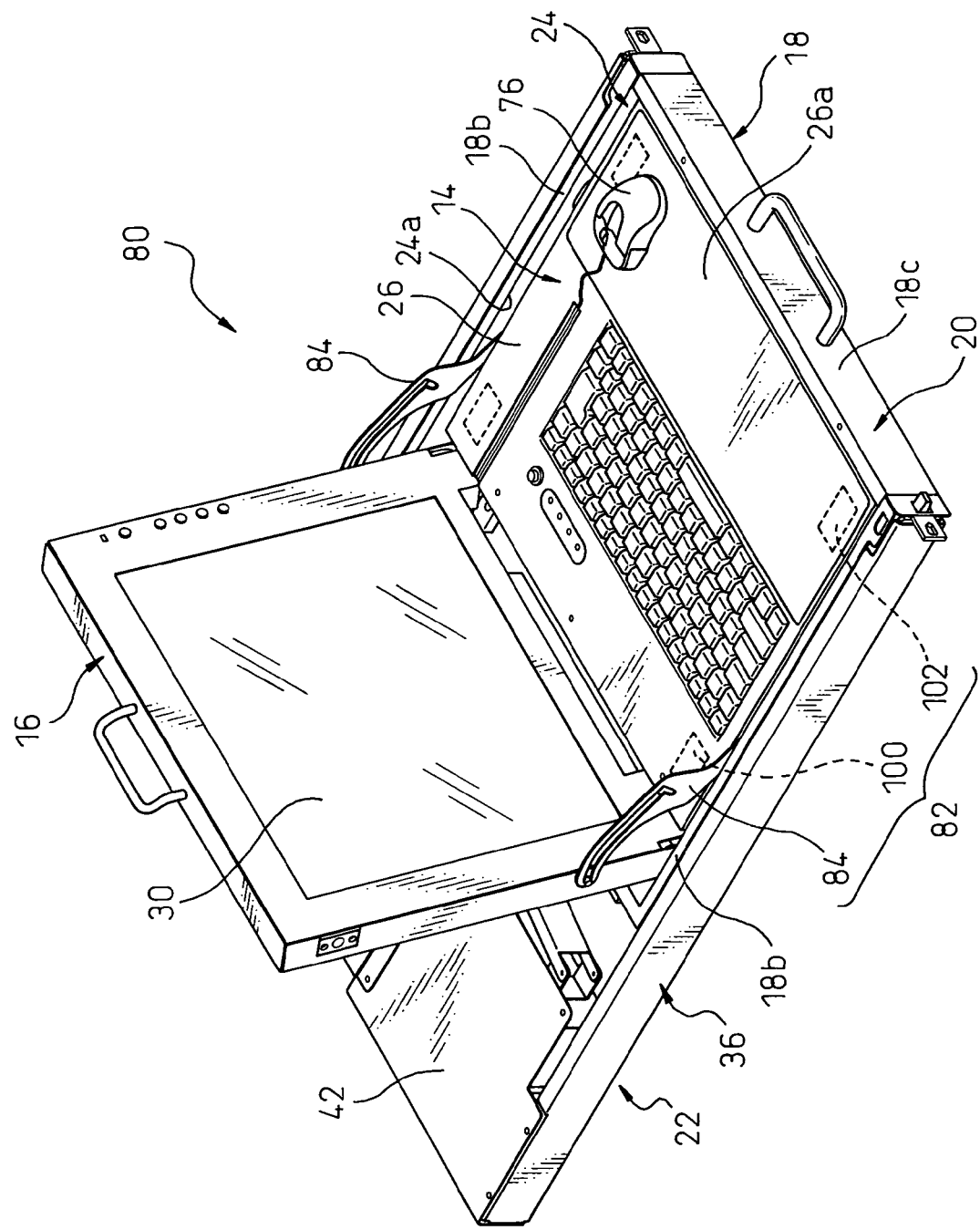
FIG. 10 is a perspective view showing a movable console device according to a second embodiment of the present invention with a console section being unfolded.
Figure 14:
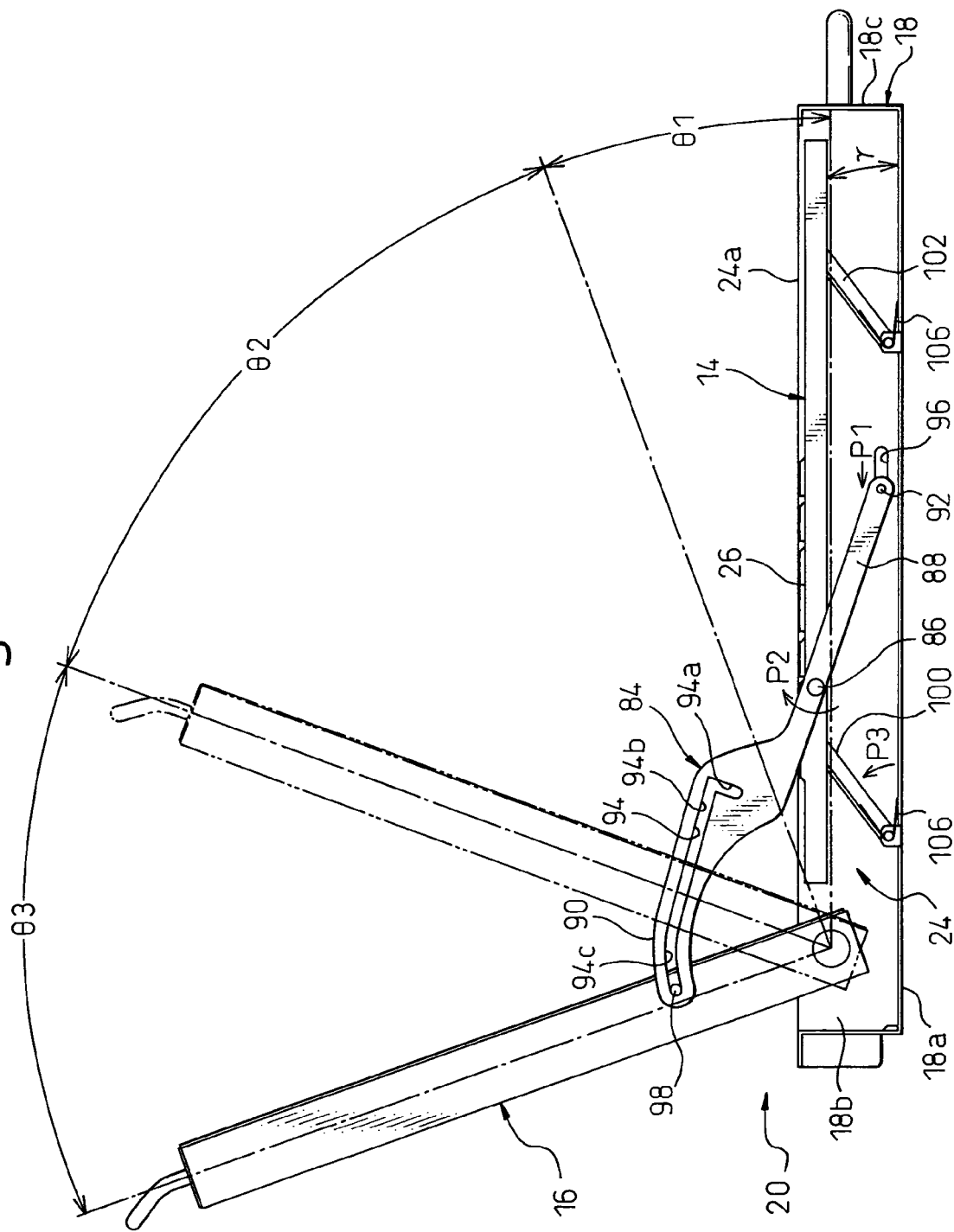
FIG. 14 is an illustration for explaining the operation of the movable console device of FIG. 10 with the console section being unfolded.

The keyboard support mechanism 82 includes an interlocking member 84 for interlocking or linking the above-described displacement motion of the keyboard 14 between the first position and the second position and the above-described displacement motion of the display 16 between the non-operating position and the operating position with each other. The interlocking member 84 functions, as the operator shifts the display 16 from the non-operating position in which the display 16 is laid on the keyboard 14 in the receiving portion 24 (FIGS. 11 to 13B) to the operating position in which the display 16 extends outside the receiving portion 24 (FIGS. 10 and 14), to automatically displace the keyboard 14 in a passive manner from the first position in which the keyboard 14 is placed on the bottom wall 18*a* of the frame member 18 (FIGS. 11 to 13B) to the second position in which the keyboard 14 is located adjacent to the open end 24*a* of the receiving portion (FIGS. 10 and 14). Similarly, the interlocking member 84 functions, as the operator shifts the display 16 from the operating position to the non-operating position, to automatically displace the keyboard 14 in a passive manner from the second position to the first position.

Figure 15:
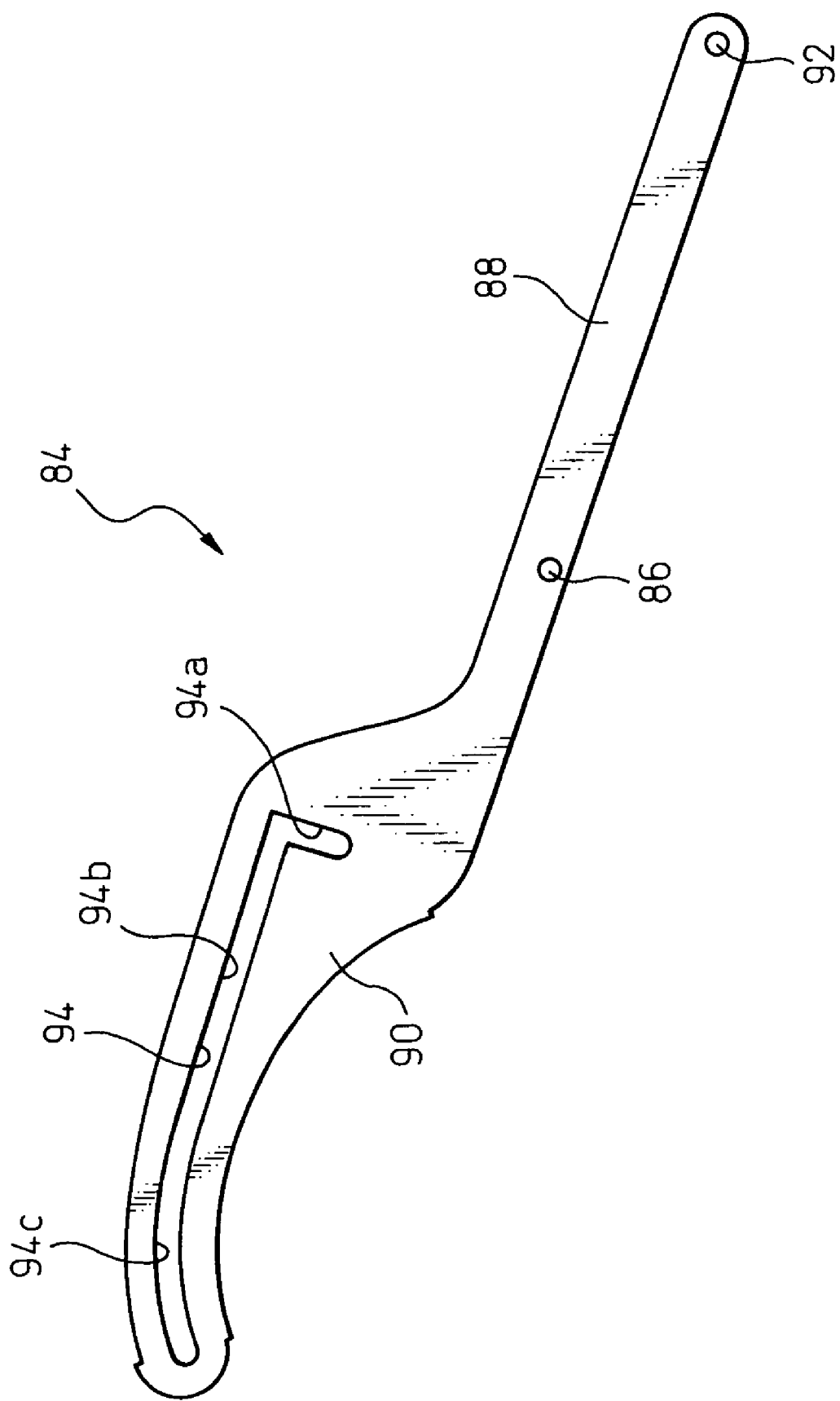
FIG. 15 is a plan view showing one component of the keyboard support mechanism of the movable console device of FIG. 10.

In the illustrated embodiment, a pair of interlocking members 84 is provided in association with the left and right lateral surfaces of the keyboard 14 as seen by an operator (i.e., in proximity to the respective opposing lateral walls 18*b* of the frame member 18). As shown in FIG. 15 in an enlarged manner, each of the interlocking members 84 is a flat plate member having a specific contour, which is provided with an attachment point 86 located substantially at the center thereof to be rotatably joined to the lateral surface of the keyboard 14, and integrally includes a first arm portion 88 extending linearly in one direction from the attachment point 86 and a second arm portion 90 extending in a curved manner in another opposite direction from the attachment point 86. The first arm portion 88 of each interlocking member 84 is provided, at its distal end away from the attachment point 86, with an engagement point 92 for engagement with the corresponding lateral wall 18*b* of the frame member 18. On the other hand, the second arm portion 90 is provided with a cam groove 94 formed through the flat plate material and extending along a longitudinal direction while bending in an L-shaped manner, for engagement with the corresponding lateral wall of the display 16. More specifically, the cam groove 94 has a starting end length 94*a* (as the short side length of the L-shape) extending in a direction substantially perpendicular to the first arm portion 88 at an area adjacent to the attachment point 86, an intermediate length 94*b* intersecting the starting end length 94*a* and extending linearly in a direction substantially parallel to the first arm portion 88, and a terminating end length 94*c* adjacent to the intermediate length 94*b* and extending in a curved manner with a predetermined curvature at an area away from the attachment point 86.

As shown in FIG. 12, each of the interlocking members 84 is rotatably joined to a predetermined position on the corresponding lateral surface of the keyboard 14 through a pivot shaft 86*a* attached to the attachment point 86, with the planar faces of the first and second arm portions 88, 90 being oriented substantially parallel to the lateral surface of the keyboard 14. Also, a slider 92*a* is attached to the engagement point 92 of the first arm portion 88 of each interlocking member 84, so that the slider 92*a* is received in an oblong hole 96 formed in the corresponding lateral wall 18*b* of the frame member 18 and is engaged with the oblong hole 96 slidably in its extending direction parallel to the bottom wall 18*a*. Further, a guide pin 98 protruding from the corresponding lateral wall of the display 16 is received in the cam groove 94 of the second arm portion 90 of each interlocking member 84, and the guide pin 98 is engaged with the cam groove 94 slidably in its extending direction.

Figure 16:
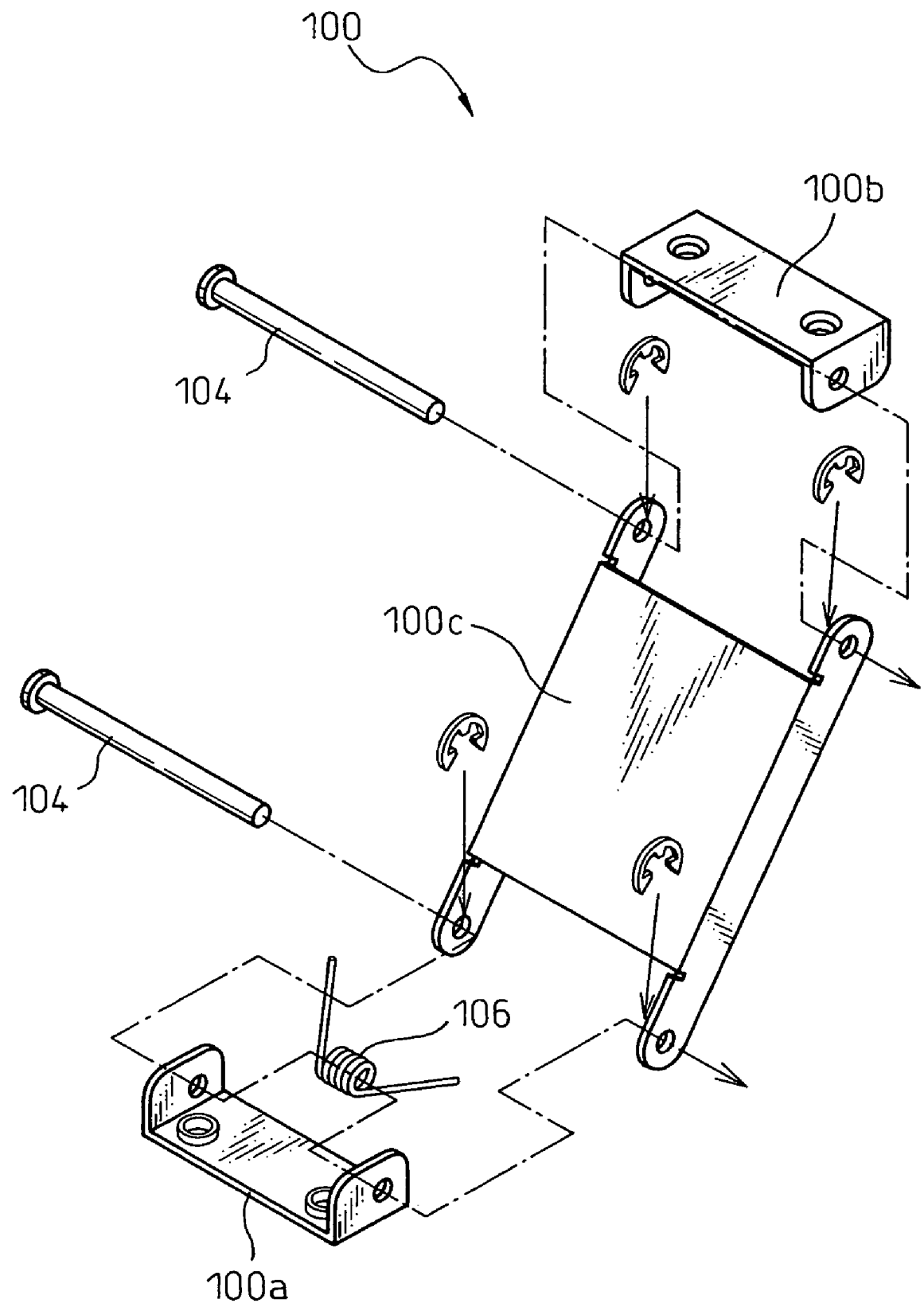
FIG. 16 is an exploded perspective view showing another component of the keyboard support mechanism of the movable console device of FIG. 10.

The keyboard support mechanism 82 further includes two pairs of movable leg members 100 and 102, provided between the frame member 18 and the keyboard 14, for guiding the keyboard 14 between the first position and the second position. The first pair of movable leg members 100 is disposed adjacent to left and right corners, at a far side as seen by an operator, on the housing 58 of the keyboard 14, and the second pair of movable leg members 102 is disposed adjacent to left and right corners, at a near side as seen from the operator, on the housing 58 of the keyboard 14. The movable leg members 100, 102 have respective configurations somewhat similar to those of the movable leg members 56, 70 in the keyboard support mechanism 54 of the movable console device 10 of the first embodiment. For example, as shown in FIG. 16, each of the movable leg members 100 includes a first fixed piece 100*a* secured to the frame member 18, a second fixed piece 100*b* secured to the keyboard 14, and a swinging piece 100*c* rotatably joined to each of the first fixed piece 100*a* and the second fixed piece 100*b* to extend therebetween. Also, each movable leg member 100 is provided with a spring (e.g., a torsion coil spring as illustrated) 106 acting not only as biasing means for biasing the keyboard 14 from the first position toward the second position but also as a buffering element for buffering the displacement motion of the keyboard 14 from the second position to the first position.

On the other hand, the movable leg members 100, 102 are configured so that the swinging piece of each movable leg member swings in a direction opposite to the swinging direction of the swinging piece of each movable leg member 56, 70 in the movable console device 10, during the displacement of the keyboard 14 between the first position and the second position. For example, in each movable leg member 100, when the keyboard 14 is in the first position, the first and second fixed pieces 100*a*, 100*b* do not overlap the swinging piece 100*c* and are disposed side by side relative to the swinging piece 100c in a flat-opened attitude on the bottom wall 18a of the frame member 18 (FIG. 13B). Also, when the keyboard 14 is shifted to the second position, the swinging piece 100c is disposed at a position where it is rotated at less than 90° with respect to the frame member's bottom wall 18a (FIG. 14). As a result, during the displacement of the keyboard 14 from the first position to the second position, the far-side region of the keyboard 14, as seen from the operator, moves about a pivot shaft 104 on the first fixed piece 100a secured to the frame member 18, along a circular arcuate orbit in a direction as to gradually shift away from the operator. The movable leg members 100, 102, both configured as described above, cooperate in synchronization with each other, so that the keyboard 14 is shifted along the circular orbit γ (FIG. 14) in parallel translation, while maintaining the horizontal attitude of the keyboard 14 in parallel to the frame member's bottom wall 18a, during the displacement of the keyboard 14 between the first position and the second position.

The movable console device 80 configured as described above is operated as follows.

Figure 11:
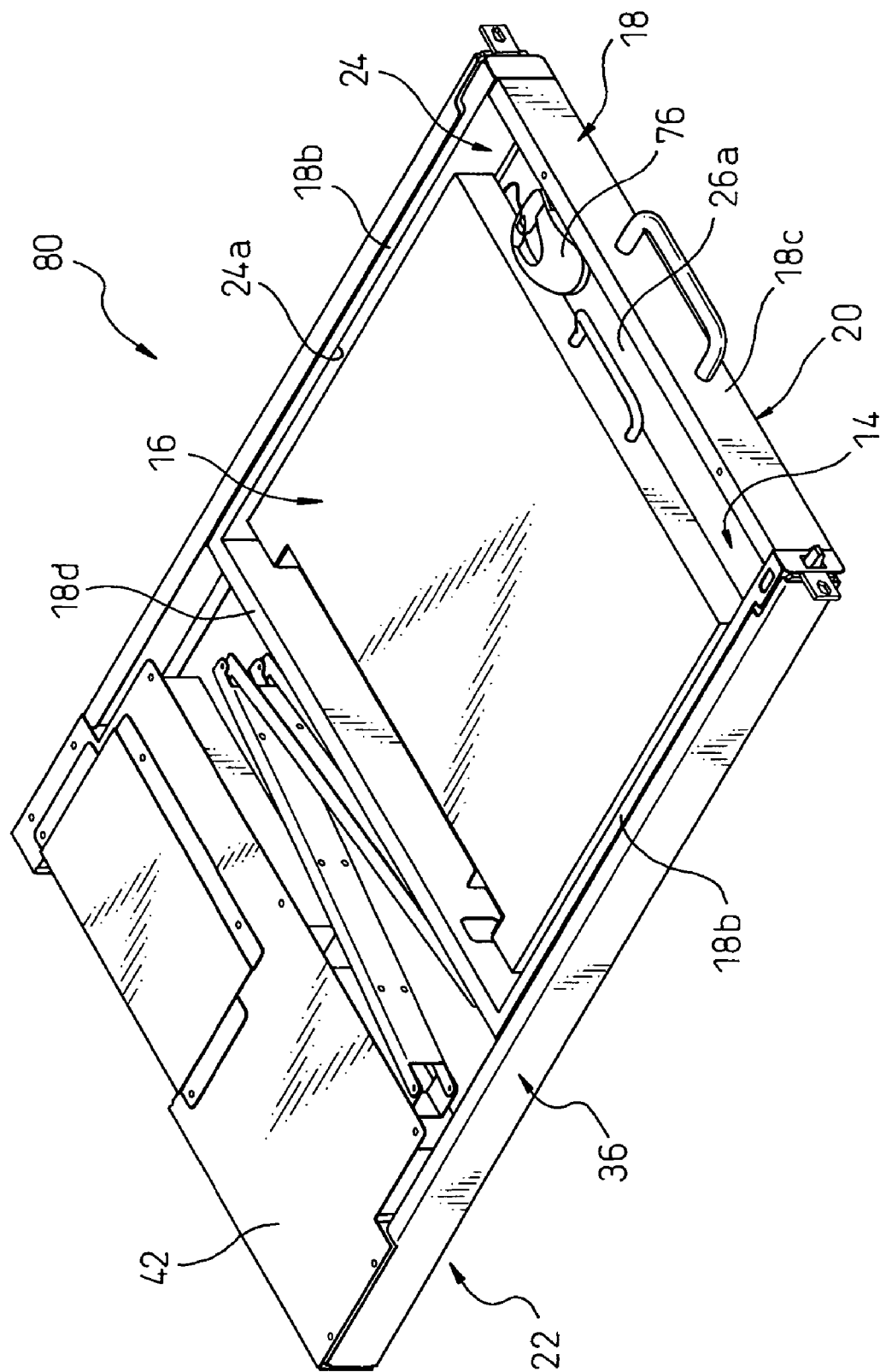
FIG. 11 is a perspective view showing the movable console device of FIG. 10 in a folded state.

First, as already described, the movable console device 80 is mounted through the mount section 22 to the rack structure 12 (FIG. 3), in the shelf zone of the standard unit height (1U) at a desired height position on the rack structure 12, in the folded state as shown in FIGS. 11 to 13, in such a manner as to be able to be taken in and out of the shelf zone. At this time, in the console section 20, the keyboard 14 is disposed at the first position and the display 16 is disposed at the non-operating position, in the interior of the receiving portion 24 defined by the frame member 18. When the movable console device 80 is used, the operator slidingly draws out the console section 20 from the corresponding shelf zone and places it in the front limit position of a linear movement range defined by the slide rail mechanisms 36 of the mount section 22. In this state, the operator manually pulls up the display 16 on the receiving portion 24 to rotate it from the non-operating position to the operating position on the frame member 18.

During the period when the display 16 is in the non-operating position, each of the pair of interlocking members 84 shows an attitude in which the first arm portion 88 is laid horizontally on the bottom wall 18a of the frame member 18, along the lateral surface of the keyboard 14 in the first position. At this time, the second arm portion 90 of each interlocking member 84 is disposed along the lateral surface of the display 16 in the non-operating position, in such a manner as not to protrude outside the receiving portion 24. In this state, the engagement point 92 provided at the end of the first arm portion 88 is positioned at one end of the oblong hole 96 in the corresponding frame member's lateral wall 18b (or at an end of the oblong hole nearer the front wall 18c), and the guide pin 98 of the display 16 is positioned at the end of the starting end length 94a of the cam groove 94 of the second arm portion 90 (FIG. 13A).

When the display 16 is rotated from the above state toward the operating position, each of a pair of guide pins 98 is shifted in relative movement along the cam groove 94 of the corresponding interlocking member 84 and, along therewith, each interlocking member 84 rotates about the attachment point 86 in a clockwise direction in the drawing (shown by an arrow P2 in FIG. 14) while the engagement point 92 provided at the other end slides along the oblong hole 96 in the frame member's lateral wall 18b (shown by an arrow P1 in FIG. 14). At this time, the guide pin 98, the engagement point 92 and the attachment point 86 act as a force application point, a fulcrum and an action point of a lever structure, respectively, and an external force manually applied to rotate the display 16 is thus transferred from the guide pin 98 to the interlocking member 84 so as to act to pull up the second arm portion 90 of the interlocking member 84 outward from the receiving portion 24 and to lift the keyboard 14 from the first position in the frame member 18 through the attachment point 86. In this connection, the springs 106 provided in conjunction with the two pairs of movable leg members 100, 102 act to assist the force for lifting the keyboard 14 from the first position in the frame member 18. Due to the interlocking function of the pair of interlocking members 84 as well as the guiding function of the two pairs of movable leg members 100, 102 (as shown by an arrow P3 in FIG. 14), the keyboard 14 automatically (or passively) reaches the second position at an instant when the display 16 reaches the operating position (FIGS. 10 and 14).

The interlocking and guiding function of the keyboard support mechanism 82 will be described in more detail with reference to FIG. 14. First, in an initial stage (in a shifting range of an angle θ1 in the drawing) wherein the display 16 is pulled up from the non-operating position, the guide pin 98 moves along the starting end length 94a of the cam groove 94 of the interlocking member 84, so that a pull-up force (or a rotating force) by the manual operation is not substantially transferred to the interlocking member 84, and thus the keyboard 14 remains in the first position. Next, when the display 16 is further rotated toward the operating position, the guide pin 98 moves along the intermediate length 94b of the cam groove 94 of the interlocking member 84 and, during this stage, the rotating force is transferred to the interlocking member 84, so that the keyboard 14 is lifted from the first position to the second position as described above. Then, at an instant when the display 16 has been rotated further from the initial stage by a predetermined angle (as shown by an angle θ2 in the drawing), the keyboard 14 reaches the second position. After that, until the display 16 reaches the operating position (in a shifting range of an angle θ3 in the drawing), the guide pin 98 moves along the terminating end length 94c of the cam groove 94, which has a curvature conforming to the moving locus of the guide pin 98 itself, so that the rotating force is not substantially transferred to the interlocking member 84, and thus the keyboard 14 remains in the second position.

In the condition where the keyboard 14 is disposed at the second position, due to the function of the keyboard support mechanism 82, the operating surface 26 of the keyboard 14 is located adjacent to the open end 24a of the receiving portion 24 defined by the frame member 18. In other words, the operating surface 26 is located at a position adjacent to the top ends of the lateral walls 18b of the frame member 18 with respect to the bottom wall 18a (FIG. 14). Therefore, it is possible for the operator to perform the key entry operation smoothly on the keyboard 14 in the second position, without the operator's hands hitting against the lateral walls 18b of the frame member 18.

Further, in the condition where the display 16 is disposed in the operating position, each of the pair of guide pins 98 is positioned at the distal end of the terminating end length 94c of the cam groove 94 of the corresponding interlocking member 84. At this time, the external force applied to the keyboard 14 (in particular, the pressing force applied to the operating surface 26 by the operator's hands in the key entry operation) is exerted in a direction where the guide pin 98 comes into abutment with the upper edge of the cam groove 94, whereby it is surely prevented that the pressing force acts to cause a relative movement between the guide pin 98 and the interlocking member 84 and to return the keyboard 14 from the second position to the first position. The keyboard 14 is thus supported, at the second position, substantially in parallel to the frame member's bottom wall 18*a* by the cooperation of the pair of interlocking members 84 and the two pairs of movable leg members 100, 102, constituting the keyboard support mechanism 82, with the operating surface 26 being located adjacent to the open end 24*a* of the receiving portion 24, and is stably held against the external force (in particular, the pressing force applied to the operating surface 26 by the operator's hands in the key entry operation).

It should be noted that, in the condition where the guide pins 98 of the display 16 are located either in the terminating end lengths 94*c* or in the intermediate lengths 94*b* of the cam grooves 94 of the corresponding interlocking members 84, the pressing force applied to the operating surface 26 of the keyboard 14 is also exerted in the direction where the guide pins 98 come into abutment with the upper edges of the cam grooves 94 in a manner similar to the above-described operation, so that it is possible to substantially avoid the relative movement between the guide pins 98 and the interlocking members 84 due to such pressing force. Therefore, in order to return the movable console device 80 to the folded or contracted state, it is desirable for the operator to shift the display 16 for rotation from the operating position to the non-operating position, along a procedure reverse to the above-described procedure, so as to automatically displace the keyboard 14 from the second position to the first position, and to make the keyboard 14 and the display 16 be received inside the receiving portion 24.

Further, in the movable console device 80, as the arrangement is given in that the keyboard 14 is shifted along the circular orbit γ in a direction for gradually moving away from the frame member's front wall 18*c* during the displacement of the keyboard 14 from the first position to the second position, it is possible to form a spatial zone, inside the receiving portion 24, that is not covered by the display 16 in the non-operating position, on the operating surface 26 of the keyboard 14 in the first position. Therefore, in this embodiment, a handheld-type pointing device 76, such as a mouse, can be accommodated in such spatial zone and to be placed on any surface area (e.g., a wrist-rest area 26*a*) of the operating surface 26 of the keyboard 14 (FIGS. 10 and 11). According to this configuration, in the case where the handheld-type pointing device 76 such as the mouse is used as an auxiliary input unit, it is possible to readily ensure a surface for driving the pointing device 76, in spite of the fact that the console section 20 having the thinner structure is adopted.

As is apparent from the above description, the movable console device 80 having the illustrated configuration also accomplish a remarkable effect similar to that of the movable console device 10 of the first embodiment. In particular, according to the movable console device 80, the displacement motion of the display 16 between the non-operating position and the operating position is linked or interlocked with the displacement motion of the keyboard 14 between the first position and the second position by the interlocking members 84, so that it is possible to facilitate the handling of the movable console device 80, especially at an instant when the operation of the movable console device 80 is to be started or finished.

It should be noted that the movable console device according to the present invention is not configured to force the keyboard to be located at the second position during the key entry operation. The operator may perform the key entry operation while the keyboard remains in the first position in the receiving portion. Also, as shown in the above-described embodiments, the movable console device according to the present invention may be configured so that the operating surface of the keyboard supported at the second position by the keyboard support mechanism may be disposed either at a position where the operating surface protrudes outside the receiving portion, a position where the operating surface coincides with the open end, or a position where the operating surface is retracted inside the receiving portion, within a certain range around the open end of the receiving portion. In either configuration, it is possible to smoothly perform a key entry operation to the keyboard in the second position, in comparison with a case where a key entry operation is performed to the keyboard remaining in the first position on the frame member. Further, it is possible to provide a plurality of second positions, on the frame member, selectable by the operator.

As will be understood from the above description, the movable console device according to the present invention is advantageously used to be contained in a rack structure in a drawer-like manner, wherein the rack structure contains one or more rack-mount type electronic devices (such as a server) laying therein as a multi-shelf configuration. In particular, the movable console device of the invention includes the thinner console section able to be contained in the shelf zone of the standard unit height (e.g., 1U), which significantly contributes to save a space without deteriorating operability.

While the invention has been particularly shown and described with reference to preferred embodiments thereof, it will be understood by those skilled in the art that various changes and modifications may be made without departing from the spirit and scope of the following claims.

The invention claimed is:

1. A movable console device having a rack-mount configuration, comprising:
   a console section including a keyboard and a display, said console section being provided with a receiving portion for receiving said keyboard and said display;
   a display support mechanism supporting said display on said console section to be displaceable between a non-operating position in which said display is received inside said receiving portion and an operating position in which said display extends outside said receiving portion;
   a keyboard support mechanism supporting said keyboard on said console section so as to be displaceable, relative to said display, between a first position in which said keyboard is received inside said receiving portion and a second position higher than said first position; and
   a mount section movably mounting said console section onto a rack structure,
   wherein
      said console section includes a frame member defining said receiving portion, and wherein said keyboard support mechanism includes a first movable leg member arranged between said frame member and said keyboard to guide said keyboard between said first position and said second position.

2. A movable console device according to claim 1, wherein said receiving portion of said console section has an open end, through which said display in said operating position extends outwardly, and wherein said keyboard support mechanism supports said keyboard in said second position to locate an operating surface of said keyboard in close proximity to said open end.

3. A movable console device according to claim 1, wherein said keyboard support mechanism fixedly holds said keyboard in said second position against a pressing force applied to an operating surface of said keyboard.

4. A movable console device according to claim 1, wherein said keyboard support mechanism includes an interlocking member for interlocking a displacement motion of said keyboard between said first position and said second position, and a displacement motion of said display between said non-operating position and said operating position, with each other.

5. A movable console device according to claim 1, wherein said first movable leg member includes a buffering element for buffering a displacement motion of said keyboard from said second position to said first position.

6. A movable console device according to claim 1, wherein said keyboard support mechanism includes a second movable leg member arranged between said frame member and said keyboard, said first movable leg member and said second movable leg member cooperating in synchronization to shift said keyboard between said first position and said second position in parallel translation.

7. A movable console device according to claim 1, wherein said keyboard support mechanism includes a support surface provided in association with said frame member, said support surface supporting said keyboard at said second position.

8. A movable console device according to claim 1, wherein said console section further includes an auxiliary stage on which a handheld-type pointing device is placed, said auxiliary stage being shiftable relative to said keyboard.

9. A movable console device according to claim 1, wherein said console section exhibits a plate-like profile able to be contained in a shelf zone of a standard unit height, in a condition where said keyboard and said display are received within said receiving portion.

10. A rack mountable, movable console device, comprising:
   a console section having a receiving portion receiving a keyboard and a display;
   a first mechanism supporting said display on said console section for movement between a first position, in which said display is received inside said receiving portion, and an operating position, in which said display extends outside said receiving portion; and
   a second mechanism supporting said keyboard on said console section for movement relative to said display, between a first position in which said keyboard is received inside said receiving portion and a second position in which said keyboard protrudes outside the receiving portion,
   wherein
   said console section includes a frame member defining said receiving portion, and wherein said keyboard support mechanism includes a first movable leg member arranged between said frame member and said keyboard to guide said keyboard between said first position and said second position.

11. A movable console device according to claim 10, wherein said receiving portion of said console section has an open end, through which said display in said operating position extends outwardly, and wherein said keyboard support mechanism supports said keyboard in said second position to locate an operating surface of said keyboard in close proximity to said open end.

12. A movable console device according to claim 10, wherein said keyboard support mechanism fixedly holds said keyboard in said second position against a pressing force applied to an operating surface of said keyboard.

13. A movable console device according to claim 1, wherein said keyboard support mechanism includes an interlocking member for interlocking a displacement motion of said keyboard between said first position and said second position, and a displacement motion of said display between said non-operating position and said operating position, with each other.

14. A movable console device according to claim 10, wherein said first movable leg member includes a buffering element for buffering a displacement motion of said keyboard from said second position to said first position.

15. A movable console device according to claim 10, wherein said keyboard support mechanism includes a second movable leg member arranged between said frame member and said keyboard, said first movable leg member and said second movable leg member cooperating in synchronization to shift said keyboard between said first position and said second position in parallel translation.

16. A movable console device according to claim 10, wherein said keyboard support mechanism includes a support surface provided in association with said frame member, said support surface supporting said keyboard at said second position.

17. A movable console device according to claim 1, wherein said console section further includes an auxiliary stage on which a handhold-type pointing device is placed, said auxiliary stage being shiftable relative to said keyboard.

18. A movable console device according to claim 1, wherein said console section exhibits a plate-like profile able to be contained in a shelf zone of a standard unit height, in a condition where said keyboard and said display are received within said receiving portion.

* * * * *

UNITED STATES PATENT AND TRADEMARK OFFICE
CERTIFICATE OF CORRECTION

PATENT NO. : 7,187,554 B2 Page 1 of 1
APPLICATION NO. : 10/916589
DATED : March 6, 2007
INVENTOR(S) : Fujio Seki et al.

It is certified that error appears in the above-identified patent and that said Letters Patent is hereby corrected as shown below:

Claim 17
Column 18, Line 44, change "handhold-type" to --handheld-type--.

Signed and Sealed this

Tenth Day of July, 2007

JON W. DUDAS
*Director of the United States Patent and Trademark Office*